(12) United States Patent
Tamamushi et al.

(10) Patent No.: US 11,443,924 B2
(45) Date of Patent: Sep. 13, 2022

(54) UPPER ELECTRODE AND PLASMA PROCESSING APPARATUS

(71) Applicant: Tokyo Electron Limited, Tokyo (JP)

(72) Inventors: Gen Tamamushi, Miyagi (JP); Kazuya Nagaseki, Miyagi (JP); Chishio Koshimizu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 232 days.

(21) Appl. No.: 16/738,369

(22) Filed: Jan. 9, 2020

(65) Prior Publication Data

US 2020/0234930 A1   Jul. 23, 2020

(30) Foreign Application Priority Data

Jan. 17, 2019 (JP) .............................. JP2019-006074

(51) Int. Cl.
*H01J 37/32* (2006.01)

(52) U.S. Cl.
CPC .. *H01J 37/32651* (2013.01); *H01J 37/32449* (2013.01); *H01J 37/32541* (2013.01)

(58) Field of Classification Search
None
See application file for complete search history.

(56) References Cited

U.S. PATENT DOCUMENTS

| 9,449,859 B2* | 9/2016 | Song ................... C23C 16/4411 |
| 2002/0004134 A1* | 1/2002 | Shima ........................ C09J 7/35 428/354 |
| 2017/0069470 A1* | 3/2017 | Murakami .......... H01J 37/3244 |
| 2019/0198299 A1* | 6/2019 | Watanabe ......... H01L 21/67069 |

FOREIGN PATENT DOCUMENTS

JP         2015-216261 A      12/2015

* cited by examiner

*Primary Examiner* — Jason Berman

(74) *Attorney, Agent, or Firm* — Studebaker & Brackett PC

(57) ABSTRACT

An upper electrode for a plasma processing apparatus, includes an electrode having a gas discharge hole, a gas plate having a gas flow path formed at a position facing the gas discharge hole to supply a processing gas to the gas discharge hole, an electrostatic attraction part interposed between the electrode and the gas plate and having a contact surface that is in contact with a lower surface of the gas plate and an attraction surface that attracts an upper surface of the electrode, and a shield that shields radicals or gas moving from the gas discharge hole to a gap between the electrode and the gas plate.

15 Claims, 17 Drawing Sheets

UPPER ELECTRODE AND PLASMA PROCESSING APPARATUS

CROSS-REFERENCE TO RELATED APPLICATIONS

This application is based on and claims the benefit of priority from Japanese Patent Application No. 2019-006074 filed on Jan. 17, 2019, and the entire contents of which are incorporated herein by reference.

FIELD

Exemplary embodiments of the present disclosure relate to an upper electrode and a plasma processing apparatus.

BACKGROUND

Japanese Unexamined Patent Publication No. 2015-216261 discloses a structure that attracts an electrode plate in an upper electrode for a plasma processing apparatus. An electrostatic attraction part is interposed between the electrode plate and a plate that comes into contact with the electrode plate. The electrostatic attraction part is made of ceramic and is fixed to the lower surface of the plate through a clamp.

SUMMARY

In an exemplary embodiment, an upper electrode for a plasma processing apparatus is provided. The upper electrode includes an electrode, a gas plate, an electrostatic attraction part, and a shield. The electrode has a gas discharge hole. The gas plate has a gas flow path formed at a position facing the gas discharge hole to supply a processing gas to the gas discharge hole. The electrostatic attraction part is interposed between the electrode and the gas plate and has a contact surface that is in contact with a lower surface of the gas plate and an attraction surface that attracts an upper surface of the electrode. The shield shields radicals or gas moving from the gas discharge hole to a gap between the electrode and the gas plate.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
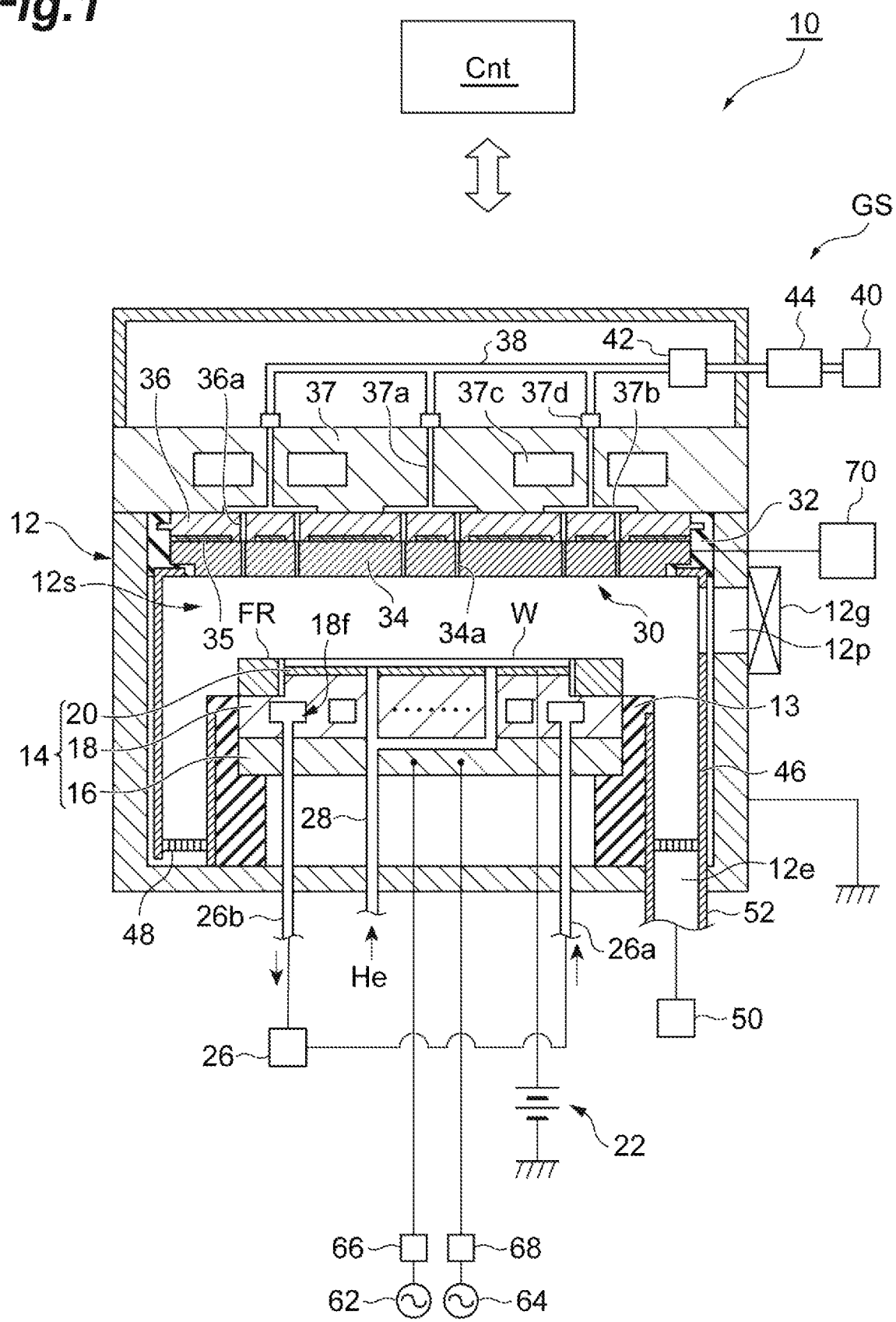
FIG. 1 illustrates a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

Hereinafter, various exemplary embodiments will be described.

In an exemplary embodiment, an upper electrode for a plasma processing apparatus is provided. The upper electrode includes an electrode, a gas plate, an electrostatic attraction part, and a shield. A gas discharge hole is formed in the electrode. A gas flow path that supplies a processing gas to the gas discharge hole is formed in the gas plate at a position facing the gas discharge hole. The electrostatic attraction part is interposed between the electrode and the gas plate and has a contact surface that is in contact with a lower surface of the gas plate and an attraction surface that attracts an upper surface of the electrode. The shield shields radicals or gas moving from the gas discharge hole to a gap between the electrode and the gas plate.

In a case where the electrostatic attraction part is interposed between the electrode and the gas plate, a gap is formed between the upper end of the gas discharge hole of the electrode and the lower end of the gas flow path of the gas plate. Since the electrode faces plasma, there is a concern that radicals or gas may infiltrate from the gas discharge hole of the electrode to enter the gap described above. There is a concern that such radicals or gas may corrode and abrade the electrostatic attraction part.

In this upper electrode, the radicals or gas moving from the gas discharge hole to a gap between the electrode and the gas plate are shielded by the shield. Accordingly, this upper electrode can improve consumption of the electrostatic attraction part due to the radicals or gas.

In an exemplary embodiment, the shield may have a connector that is interposed between the electrode and the gas plate and connects the gas discharge hole and the gas flow path. According to this exemplary embodiment, the connector can physically shield the radicals or gas moving from the gas discharge hole to a gap between the electrode and the gas plate.

In an exemplary embodiment, the gas plate may have, on a lower surface thereof, a first region facing the contact surface of the electrostatic attraction part and a second region facing the gas discharge hole. The connector may have an upper end connected to the second region of the lower surface of the gas plate, and a lower end connected to an upper surface of the electrode. The connector may have a flow path defined in an interior thereof and making the gas discharge hole and the gas flow path communicate with each other. According to this exemplary embodiment, due to the connector, it is possible to make the gas discharge hole and the gas flow path communicate with each other while physically shielding the radicals or gas moving from the gas discharge hole to a gap between the electrode and the gas plate.

In an exemplary embodiment, the connector may be formed integrally with either the gas plate or the electrode. According to this exemplary embodiment, it is possible to improve consumption of the electrostatic attraction part due to the radicals or gas without increasing the number of parts.

In an exemplary embodiment, the connector may have an upper connector formed integrally with the gas plate, and a lower connector formed integrally with the electrode and being in contact with the upper connector. According to this exemplary embodiment, it is possible to improve consumption of the electrostatic attraction part due to the radicals or gas without increasing the number of parts.

In an exemplary embodiment, the gas plate may have a passivation layer at a point of contact with the electrode. According to this exemplary embodiment, it is possible to prevent deterioration of the point of contact between the gas plate and the electrode.

In an exemplary embodiment, the connector may be formed separately from the electrode and the gas plate. According to this exemplary embodiment, it is possible to improve consumption of the electrostatic attraction part due to the radicals or gas without applying a change to the existing electrode and gas plate.

In an exemplary embodiment, the electrostatic attraction part may have a main body made of a dielectric and having elasticity, and an electrode disposed inside the main body. The electrostatic attraction part is disposed in a state where the main body is compressed between the electrode and the gas plate, and the compressed main body has the same thickness as the connector. According to this exemplary embodiment, it is possible to dispose the electrostatic attraction part without interfering with the contact between the electrode and the gas plate.

In an exemplary embodiment, the gas plate may have, on a lower surface thereof, a first region facing the contact surface of the electrostatic attraction part and a second region facing the gas discharge hole. A gap may be formed by the second region and an upper surface of the electrode. The shield can have an exhaust device capable of performing decompression, and an exhaust flow path connected to the exhaust device. The exhaust flow path may be formed in the gas plate and have a lower end located in the second region. The exhaust device may decompress the gap through the exhaust flow path. According to this exemplary embodiment, the radicals or gas moving from the gas discharge hole to a gap between the electrode and the gas plate can be suctioned from the exhaust flow path before it reaches the electrostatic attraction part. Accordingly, it is possible to improve consumption of the electrostatic attraction part due to the radicals or gas.

In an exemplary embodiment, the gas plate may have, on a lower surface thereof, a first region facing the contact surface of the electrostatic attraction part, and a second region facing the gas discharge hole. A gap may be formed by the second region and an upper surface of the electrode. The shield may have a gas supply source for a shielding gas and a supply flow path connected to the gas supply source. The supply flow path may be formed in the gas plate, have a lower end located in the second region, and supply the shielding gas from the gas supply source to the gap. According to this exemplary embodiment, the radicals or gas moving from the gas discharge hole to a gap between the electrode and the gas plate by the shielding gas can be shielded by the shielding before it reaches the electrostatic attraction part. Accordingly, it is possible to improve consumption of the electrostatic attraction part due to the radicals or gas.

In an exemplary embodiment, the shielding gas may be the same as the processing gas. According to this exemplary embodiment, it is possible to reduce the influence of the shielding gas on a process.

In an exemplary embodiment, the gas plate may have a refrigerant flow path formed therein. According to this exemplary embodiment, since it is possible to directly adjust the temperature of the gas plate, it is possible to efficiently perform heat exchange with the electrode.

The upper electrode according to an exemplary embodiment may further include a cooling plate disposed in contact with an upper surface of the gas plate and having a refrigerant flow path formed therein. According to this exemplary embodiment, it is possible to cool the electrode without processing the gas plate having the gas flow path.

In an exemplary embodiment, the electrostatic attraction part may include a first attraction part and a second attraction part. The first attraction part may have a first main body made of a dielectric and having elasticity and a first electrode disposed inside the first main body. The second attraction part may have a second main body made of a dielectric and having elasticity and a second electrode disposed inside the second main body. Voltages having different polarities may be applied to the first electrode and the second electrode. According to this exemplary embodiment, the electrode can be attracted in a bipolar manner.

In an exemplary embodiment, the electrostatic attraction part may include a first attraction part and a second attraction part. The first attraction part may have a first main body made of a dielectric and having elasticity and a first electrode disposed inside the first main body. The second attraction part may have a second main body made of a dielectric and having elasticity and a second electrode disposed inside the second main body. Voltages having the same polarity may be applied to the first electrode and the second electrode. According to this exemplary embodiment, the electrode can be attracted in a monopolar manner.

In another exemplary embodiment, a plasma processing apparatus is provided. The plasma processing apparatus includes a chamber, a substrate support, and an upper electrode. The substrate support is configured to support a substrate in the chamber. The upper electrode constitutes an upper part of the chamber. The upper electrode includes an electrode, a gas plate, an electrostatic attraction part, and a shield. A gas discharge hole is formed in the electrode. A gas flow path which supplies a processing gas to the gas discharge hole is formed in the gas plate at a position facing the gas discharge hole. The electrostatic attraction part is interposed between the electrode and the gas plate and has a contact surface that is in contact with a lower surface of the gas plate and an attraction surface that attracts an upper surface of the electrode. The shield shields radicals or gas moving from the gas discharge hole to a gap between the electrode and the gas plate.

According to this exemplary embodiment, the radicals or gas moving from the gas discharge hole to a gap between the electrode and the gas plate is shielded by the shield. Accordingly, this plasma processing apparatus can improve consumption of the electrostatic attraction part due to the radicals or gas.

In another exemplary embodiment, a method of assembling an upper electrode for a plasma processing apparatus is provided. The method includes a joining step, a positioning step, and a mounting step. In the joining step, an upper surface of an electrostatic attraction part is joined to a lower surface of a gas plate. In the joining step, the gas plate has, on the lower surface thereof, a first region which is joined to the upper surface of the electrostatic attraction part and a second region having a gas flow path. The electrostatic attraction part has a main body made of a dielectric and having elasticity and an electrode disposed inside the main body. In the positioning step, an upper surface of an electrode and the lower surface of the gas plate are positioned to satisfy the following conditions. The conditions include that a connector thinner than the electrostatic attraction part is located between the upper surface of the electrode and the second region of the lower surface of the gas plate. The conditions include that a gas discharge hole formed in the electrode to penetrate in a thickness direction faces the gas flow path. The conditions include that the upper surface of the electrode is in contact with a lower surface of the electrostatic attraction part. In the mounting step, a support member supporting the positioned electrode is mounted to the gas plate.

According to this exemplary embodiment, it is possible to assemble the upper electrode that physically shields the radicals or gas moving from the gas discharge hole to a gap between the electrode and the gas plate by the connector. Further, in a case where the electrostatic attraction part having elasticity is used, when the electrode is attracted by the electrostatic attraction part and pressed against the gas plate, there is a concern that the thickness of the electrostatic attraction part may change due to an attraction force. In this way, there is a concern that variation may occur in the thickness of the electrostatic attraction part. Such variation in thickness affects the accuracy of temperature adjustment of the electrode, and eventually affects the accuracy of plasma processing. In this method, the connector thinner than the electrostatic attraction part having elasticity is located between the upper surface of the electrode and the second region of the lower surface of the gas plate. When the electrode is attracted by the electrostatic attraction part and pressed against the gas plate, the electrostatic attraction part is compressed between the upper surface of the electrode and the lower surface of the gas plate. In this way, since the upper surface of the electrode butts against the connector, positioning in a height direction (thickness direction) can be performed. Therefore, according to this method, it is possible to suppress a decrease in accuracy of the temperature adjustment of an electrode.

In still another exemplary embodiment, a method of controlling an electrostatic attraction part that is provided at an upper portion of a plasma processing apparatus and attracts an electrode to a temperature-controlled plate is provided. The control method includes a step of applying a voltage. In the applying step, voltages having different polarities are applied to a first electrode and a second electrode of the electrostatic attraction part during at least an idle period of a plasma generation period and the idle period. In the plasma generation period, plasma is generated by the plasma processing apparatus. In the idle period, plasma is not generated by the plasma processing apparatus.

According to still another exemplary embodiment, in the idle period in which plasma is not generated, the electrode can be attracted to the temperature-controlled plate. In the plasma generation period in which plasma is generated, the temperature of the electrode rises due to heat input from the plasma. For this reason, it is necessary to adjust the temperature by attracting the electrode to the temperature-controlled plate. According to this exemplary embodiment, by adjusting the temperature even in the idle period in which there is no heat input from the plasma, it is possible to efficiently perform the temperature adjustment in the subsequent plasma generation period.

In the control method according to still another exemplary embodiment, a process period by the plasma processing apparatus may alternately include the plasma generation period and the idle period. In the step of applying voltages having different polarities, the polarity of the voltage which is applied to each of the first electrode and the second electrode may be switched every the idle period. According to this exemplary embodiment, the polarity of the electrodes is not fixed at a single polarity, whereby it is possible to avoid the movement (migration) of charges in one direction. In this way, it is possible to avoid a decrease in attraction force.

The control method according to still another exemplary embodiment may further include a step of applying a negative voltage to the electrode in the plasma generation period.

The control method according to still another exemplary embodiment may further include a step of applying voltages having the same polarity to the first electrode and the second electrode in the plasma generation period. According to this exemplary embodiment, it is possible to attract the electrode in a monopolar manner having a stronger attraction force than in a bipolar manner in the plasma generation period.

The control method according to still another exemplary embodiment may further include a step of applying a negative voltage to the electrode and applying a positive voltage to each of the first electrode and the second electrode in the plasma generation period. According to this exemplary embodiment, when a negative voltage is applied to the electrode to generate plasma, it is possible to attract the electrode.

In still another exemplary embodiment, in the step of applying voltages having the same polarity, a positive voltage may be applied to the first electrode and the second electrode to satisfy a predetermined condition. The predetermined condition is that the difference between the positive voltage which is applied to the first electrode and the second electrode and the negative voltage which is applied to the electrode coincides with the voltage value applied during the idle period. According to this exemplary embodiment, since the magnitude of the positive voltage which is applied to the first electrode and the second electrode can be reduced by the amount corresponding to the magnitude of the negative voltage which is applied to the electrode, power consumption can be suppressed.

In still another exemplary embodiment, the negative voltage which is applied to the electrode may be applied by using a direct-current power source connected to the electrode. According to this exemplary embodiment, the magnitude of the positive voltage which is applied to the first electrode and the second electrode can be reduced corresponding to the negative voltage applied to the electrode from the direct-current power source.

In still another exemplary embodiment, the negative voltage which is applied to the electrode may be applied by using a radio frequency power source connected to the electrode. According to this exemplary embodiment, the magnitude of the positive voltage which is applied to the first electrode and the second electrode can be reduced corresponding to self-bias generated in the electrode.

In still another exemplary embodiment, a plasma processing apparatus is provided. The plasma processing apparatus includes a chamber, a substrate support, an upper electrode, a first power source, a second power source, and a controller. The substrate support is configured to support a substrate in the chamber. The upper electrode configures an upper part of the chamber. The upper electrode includes a temperature-controlled plate, an electrode which is in contact with a lower surface of the plate, and an electrostatic attraction part having a first electrode and a second electrode. The electrostatic attraction part is interposed between the electrode and the plate and has a contact surface that is in contact with the lower surface of the plate and an attraction surface that attracts an upper surface of the electrode. The controller applies voltages having different polarities to the first electrode and the second electrode of the electrostatic attraction part during at least an idle period of a plasma generation period and the idle period. In the plasma generation period, plasma is generated by the plasma processing apparatus. In the idle period, plasma is not generated by the plasma processing apparatus.

According to still another exemplary embodiment, in the idle period in which plasma is not generated, the electrode can be attracted to the temperature-controlled plate. In the plasma generation period in which plasma is generated, the temperature of the electrode rises due to heat input from the plasma. For this reason, in a case where there is heat input from the plasma, it is necessary to adjust the temperature by attracting the electrode to the temperature-controlled plate. According to this exemplary embodiment, by adjusting the temperature even in the idle period in which there is no heat input from the plasma, it is possible to efficiently perform the temperature adjustment in the subsequent plasma generation period.

Hereinafter, various exemplary embodiments will be described in detail with reference to the drawings. In each drawing, identical or equivalent parts are denoted by the same reference numerals.

[Outline of Plasma Processing Apparatus]

FIG. 1 is a diagram schematically showing a plasma processing apparatus according to an exemplary embodiment. A plasma processing apparatus 10 shown in FIG. 1 is a capacitively coupled plasma etching apparatus. The plasma processing apparatus 10 is provided with a chamber main body 12. The chamber main body 12 has a substantially cylindrical shape and provides an internal space 12s. The chamber main body 12 is formed of, for example, aluminum. The inner wall surface of the chamber main body 12 is subjected to treatment having plasma resistance. For example, the inner wall surface of the chamber main body 12 is anodized. The chamber main body 12 is electrically grounded.

A passage 12p is formed in the side wall of the chamber main body 12. A workpiece W passes through the passage 12p when it is loaded into the internal space 12s and unloaded from the internal space 12s. The passage 12p can be opened and closed by a gate valve 12g.

A supporting part 13 is provided on a bottom portion of the chamber main body 12. The supporting part 13 is formed of an insulating material. The supporting part 13 has a substantially cylindrical shape. The supporting part 13 extends in a vertical direction from the bottom portion of the chamber main body 12 in the internal space 12s. The supporting part 13 supports a stage 14. The stage 14 is provided in the internal space 12s.

The stage 14 (an example of a substrate support) has a lower electrode 18 and an electrostatic chuck 20. The stage 14 can be further provided with an electrode 16. The electrode 16 may be plate. The electrode 16 is formed of a conductive material such as aluminum, for example, and has a substantially disk shape. The lower electrode 18 is provided on the electrode 16. The lower electrode 18 is formed of a conductive material such as aluminum, for example, and has a substantially disk shape. The lower electrode 18 is electrically connected to the electrode 16.

The electrostatic chuck 20 is provided on the lower electrode 18. The workpiece W is placed on the upper surface of the electrostatic chuck 20. The electrostatic chuck 20 has a main body formed of a dielectric. A film-like electrode is provided in the main body of the electrostatic chuck 20. The electrode of the electrostatic chuck 20 is connected to a direct-current power source 22 through a switch. If the voltage from the direct-current power source 22 is applied to the electrode of the electrostatic chuck 20, an electrostatic attraction force is generated between the electrostatic chuck 20 and the workpiece W. Due to the generated electrostatic attraction force, the workpiece W is attracted to the electrostatic chuck 20 and held by the electrostatic chuck 20.

An edge ring FR is disposed on the stage 14 to surround the edge of the workpiece W. The edge ring FR is provided in order to improve the in-plane uniformity of etching. The edge ring FR can be formed of silicon, silicon carbide, or quartz. However, there is no limitation thereto.

A flow path 18f is provided in the interior of the lower electrode 18. A refrigerant is supplied from a chiller unit 26 provided outside the chamber main body 12 to the flow path 18f through a pipe 26a. The refrigerant supplied to the flow path 18f is returned to the chiller unit 26 through a pipe 26b. In the plasma processing apparatus 10, the temperature of the workpiece W placed on the electrostatic chuck 20 is adjusted by the heat exchange between the refrigerant and the lower electrode 18.

The plasma processing apparatus 10 is provided with a gas supply line 28. The gas supply line 28 supplies heat transfer gas, for example, He gas, from a heat transfer gas supply mechanism, to the gap between the upper surface of the electrostatic chuck 20 and the back surface of the workpiece W.

The plasma processing apparatus 10 is further provided with an upper electrode 30. The upper electrode 30 is provided above the stage 14. The upper electrode 30 is supported on an upper portion of the chamber main body 12 through a member 32. The member 32 is formed of a material having insulation properties. The upper electrode 30 includes an electrode 34, an electrostatic chuck 35 (an example of an electrostatic attraction part), and a gas plate 36. The electrode 34 may be plate. The lower surface of the electrode 34 is a lower surface on the internal space 12s side and defines the internal space 12s. The electrode 34 can be formed of a low electric resistance conductor or semiconductor that generates less Joule heat. A plurality of gas discharge holes 34a are formed in the electrode 34. The plurality of gas discharge holes 34a penetrate the electrode 34 in a plate thickness direction thereof.

The gas plate 36 can be formed of a conductive material such as aluminum. The electrostatic chuck 35 is disposed between the gas plate 36 and the electrode 34. The configuration and voltage supply system of the electrostatic chuck 35 will be described later. Due to the attraction force of the electrostatic chuck 35, the gas plate 36 and the electrode 34 are in close contact with each other.

A cooling plate 37 (an example of a cooling plate) is disposed at an upper portion of the gas plate 36. The cooling plate 37 can be formed of a conductive material such as aluminum. A flow path 37c is provided in the interior of the cooling plate 37. A refrigerant is supplied from a chiller unit (not shown) provided outside the chamber main body 12 to the flow path 37c. The refrigerant supplied to the flow path 37c is returned to the chiller unit. In this way, the temperature of the cooling plate 37 is adjusted. In the plasma processing apparatus 10, the temperature of the electrode 34 is adjusted by the heat exchange between the refrigerant, and the gas plate 36 and the cooling plate 37.

A plurality of gas introduction paths 37a are provided to extend downward in the interior of the cooling plate 37. A plurality of gas diffusion chambers 37b are provided to correspond to the plurality of gas introduction paths 37a between the upper surface of the gas plate 36 and the lower surface of the cooling plate 37. A plurality of gas flow paths 36a are provided in the interior of the gas plate 36. The gas flow path 36a is formed to extend in the thickness direction at a position facing the gas discharge hole 34a. The gas flow path 36a extends downward from the gas diffusion chamber 37b to communicate with the corresponding gas discharge hole 34a. A plurality of gas introduction ports 37d for leading a processing gas to the plurality of gas diffusion chambers 37b are formed in the cooling plate 37. A gas supply pipe 38 is connected to the gas introduction port 37d.

A gas supply GS is connected to the gas supply pipe 38. In an embodiment, the gas supply GS includes a gas source group 40, a valve group 42, and a flow rate controller group 44. The gas source group 40 is connected to the gas supply pipe 38 through the flow rate controller group 44 and the valve group 42. The gas source group 40 includes a plurality of gas sources. The plurality of gas sources include sources of a plurality of gases configuring the processing gas which is used in a method MT. The valve group 42 includes a plurality of on-off valves. The flow rate controller group 44 includes a plurality of flow rate controllers. Each of the plurality of flow rate controllers is a mass flow controller or a pressure control type flow rate controller. The plurality of gas sources of the gas source group 40 are connected to the gas supply pipe 38 through a corresponding valve of the valve group 42 and a corresponding flow rate controller of the flow rate controller group 44.

In the plasma processing apparatus 10, a shield 46 is detachably provided along the inner wall of the chamber main body 12. The shield 46 is also provided on the outer periphery of the supporting part 13. The shield 46 prevents an etching byproduct from adhering to the chamber main body 12. The shield 46 is configured, for example, by coating a member made of aluminum with ceramics such as $Y_2O_3$.

A baffle plate 48 is provided between the supporting part 13 and the side wall of the chamber main body 12. The baffle plate 48 is configured, for example, by coating a member made of aluminum with ceramics such as $Y_2O_3$. A plurality of through-holes are formed in the baffle plate 48. An exhaust port 12e is provided below the baffle plate 48 and in the bottom portion of the chamber main body 12. An exhaust device 50 is connected to the exhaust port 12e through an exhaust pipe 52. The exhaust device 50 has a pressure control valve and a vacuum pump such as a turbo molecular pump.

The plasma processing apparatus 10 is further provided with a first radio frequency power source 62 and a second radio frequency power source 64. The first radio frequency power source 62 is a power source for generating a first radio frequency (radio frequency power) for plasma generation. The frequency of the first radio frequency is, for example, a frequency in a range of 27 MHz to 100 MHz. The first radio frequency power source 62 is connected to the lower electrode 18 through a matching device 66 and the electrode 16. The matching device 66 has a circuit for matching the output impedance of the first radio frequency power source 62 with the input impedance on the load side (the lower electrode 18 side). The first radio frequency power source 62 may be connected to the upper electrode 30 through the matching device 66.

The second radio frequency power source 64 is a power source for generating a second radio frequency (another radio frequency power) for drawing ions into the workpiece W. The frequency of the second radio frequency is lower than the frequency of the first radio frequency. The frequency of the second radio frequency is, for example, a frequency in a range of 400 kHz to 13.56 MHz. The second radio frequency power source 64 is connected to the lower electrode 18 through a matching device 68 and the electrode 16. The matching device 68 has a circuit for matching the output impedance of the second radio frequency power source 64 with the input impedance on the load side (the lower electrode 18 side).

The plasma processing apparatus 10 is further provided with a direct-current power source unit 70. The direct-current power source unit 70 is connected to the upper electrode 30. The direct-current power source unit 70 can generate a negative direct-current voltage and apply the direct-current voltage to the upper electrode 30.

The plasma processing apparatus 10 can be further provided with a controller Cnt. The controller Cnt can be a computer which includes a processor, a storage unit, an input device, a display device, and the like. The controller Cnt controls each part of the plasma processing apparatus 10. In the controller Cnt, an operator can perform a command input operation or the like by using the input device in order to manage the plasma processing apparatus 10. Further, in the controller Cnt, the operating status of the plasma processing apparatus 10 can be visualized and displayed by the display device. Further, a control program and recipe data for controlling various processing which is executed in the plasma processing apparatus 10 by the processor are stored in the storage unit of the controller Cnt. The processor of the controller Cnt executes the control program and controls each part of the plasma processing apparatus 10 according to the recipe data, whereby a method to be described later is executed in the plasma processing apparatus 10.

[Outline of Upper Electrode]

Figure 2:
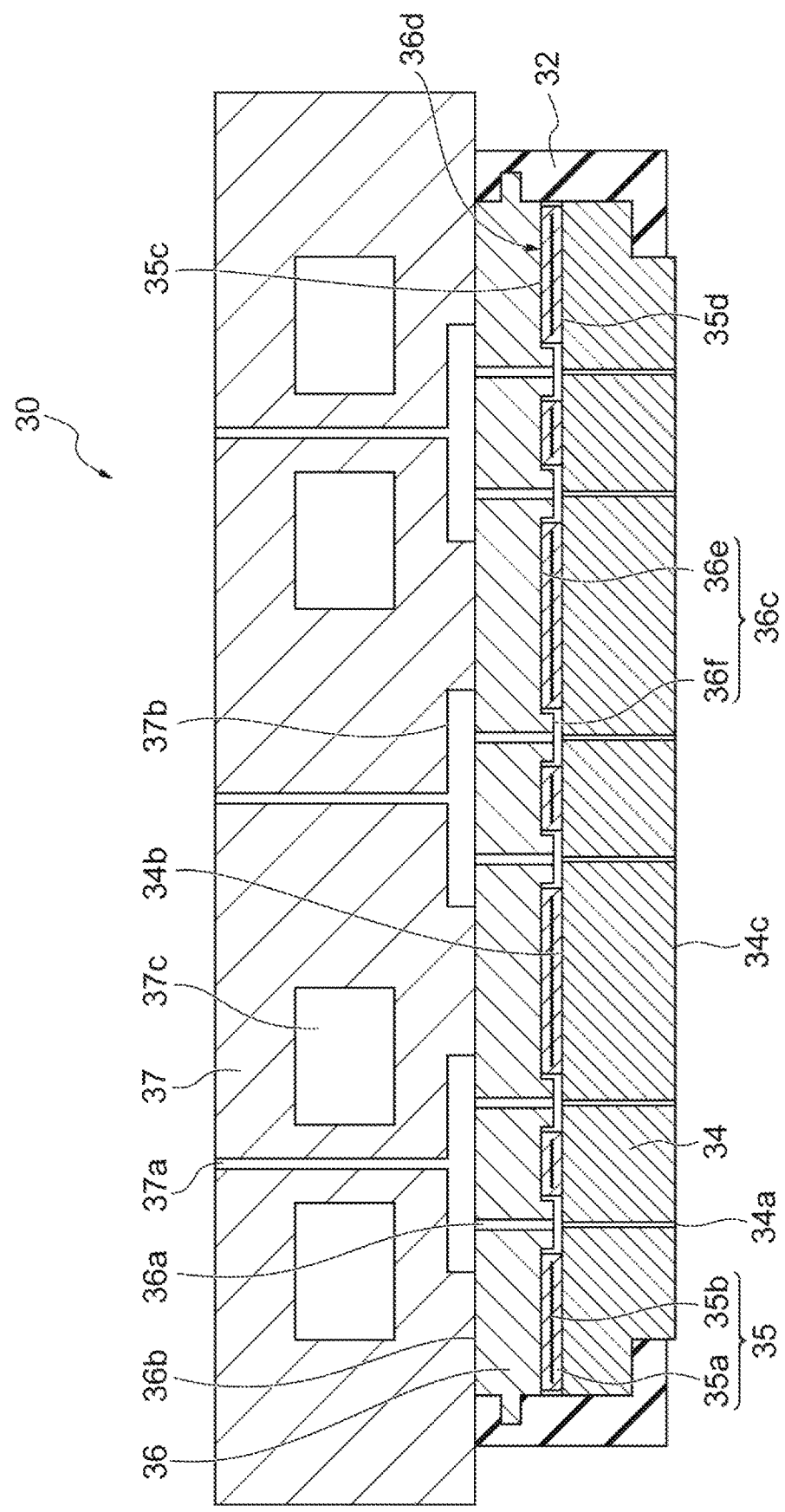
FIG. 2 is a sectional view of an upper electrode according to an exemplary embodiment.

FIG. 2 is a sectional view of an upper electrode according to an exemplary embodiment. As shown in FIG. 2, the upper electrode 30 has a structure in which the electrode 34, the gas plate 36, and the cooling plate 37 are stacked in order from below.

The electrostatic chuck 35 is interposed between the electrode 34 and the gas plate 36. The upper surface of the electrostatic chuck 35 is a contact surface 35c that comes into contact with a lower surface 36c of the gas plate 36, and is fixed to the lower surface 36c of the gas plate 36 with an adhesive or the like. The lower surface of the electrostatic chuck 35 is an attraction surface 35d that attracts an upper surface 34b of the electrode 34.

The lower surface 36c of the gas plate 36 may have a first region 36e facing the contact surface 35c of the electrostatic chuck 35 and a second region 36f facing the gas discharge hole 34a. The second region 36f protrudes downward further than the first region 36e, whereby an accommodation portion 36d is formed. The electrostatic chuck 35 is disposed in the accommodation portion 36d.

The electrostatic chuck 35 has a main body 35a formed of a dielectric. The main body 35a has elasticity. An electrode 35b is provided in the interior of the main body 35a. The electrode 35b is connected to a direct-current power source. The connection with the power source will be described later. If the voltage from the direct-current power source is applied to the electrode 35b of the electrostatic chuck 35, an electrostatic attraction force is generated between the electrostatic chuck 35 and the electrode 34. Due to the generated electrostatic attraction force, the electrode 34 is attracted to the electrostatic chuck 35 and held by the electrostatic chuck 35. The upper electrode 30 shown in FIG. 2 is an upper electrode in a state where the voltage is not applied to the electrostatic chuck 35. The thickness of the electrostatic chuck 35 before the voltage application is thicker than a protrusion length of the second region 36f with the first region 36e as a reference.

Figure 3:
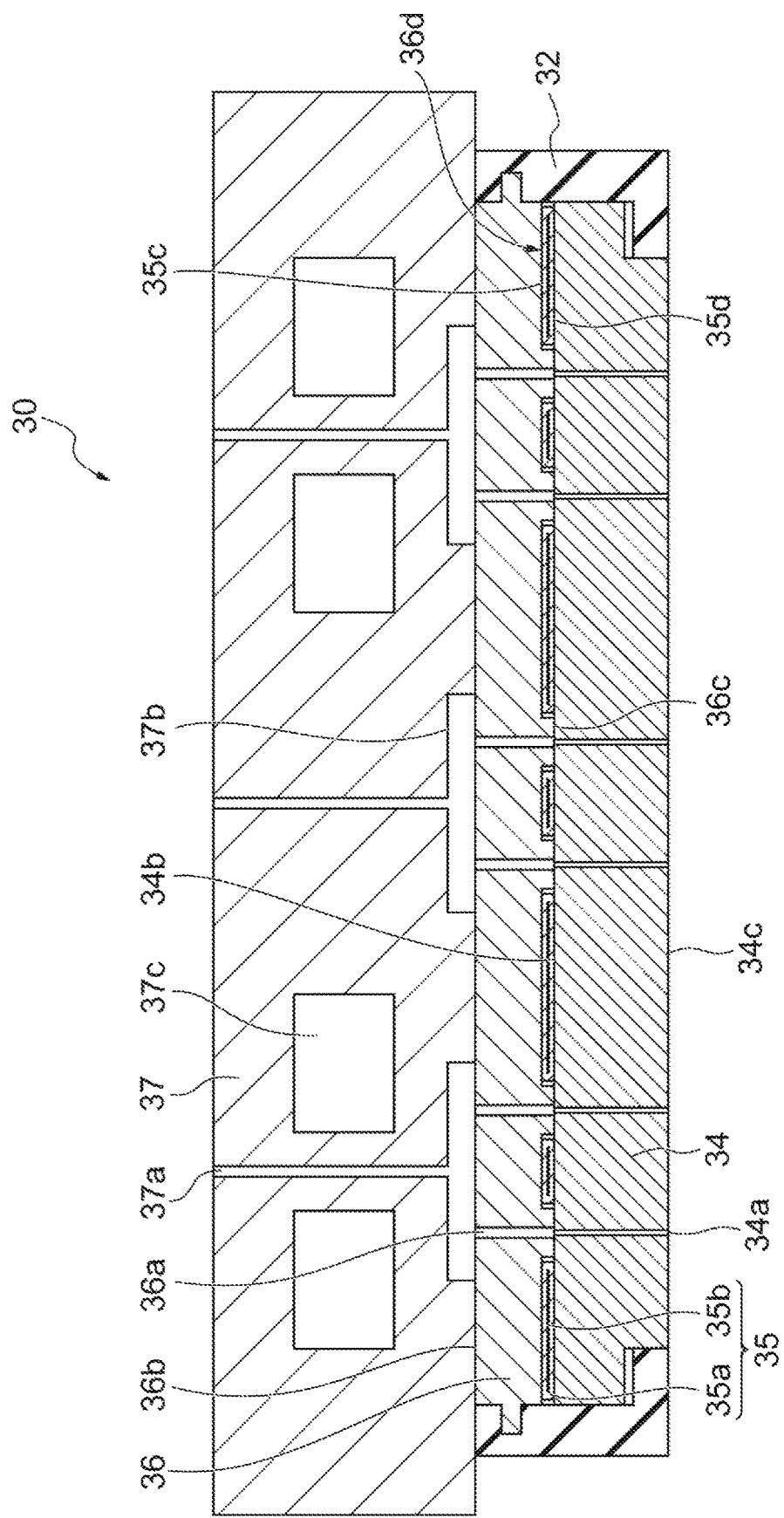
FIG. 3 is a sectional view of the upper electrode according to an exemplary embodiment.

FIG. 3 is a sectional view of the upper electrode according to an exemplary embodiment. FIG. 3 is a diagram showing a state where the voltage is applied to the electrostatic chuck 35 in FIG. 2. As shown in FIG. 3, if the voltage is applied to the electrostatic chuck 35, the electrode 34 can be attracted to the gas plate 36 by the electrostatic chuck 35. At this time, the electrostatic chuck 35 is sandwiched and pressed between the electrode 34 and the gas plate 36. Since the main body 35a of the electrostatic chuck 35 has elasticity, it is compressed and pushed into the accommodation portion 36d. Then, the upper surface 34b of the electrode 34 butts against the lower surface 36c of the gas plate 36, whereby the rising of the electrode 34 is stopped. In this manner, the electrostatic chuck 35 is disposed in a state where the main body 35a is compressed between the electrode and the gas plate by the action of the electrostatic chuck 35. The electrostatic chuck 35 after the voltage application has the same thickness as the protrusion length of the second region 36f with the first region 36e as a reference. For this reason, the upper surface 34b of the electrode 34 comes into close contact with the lower surface 36c of the gas plate 36.

Figure 4:
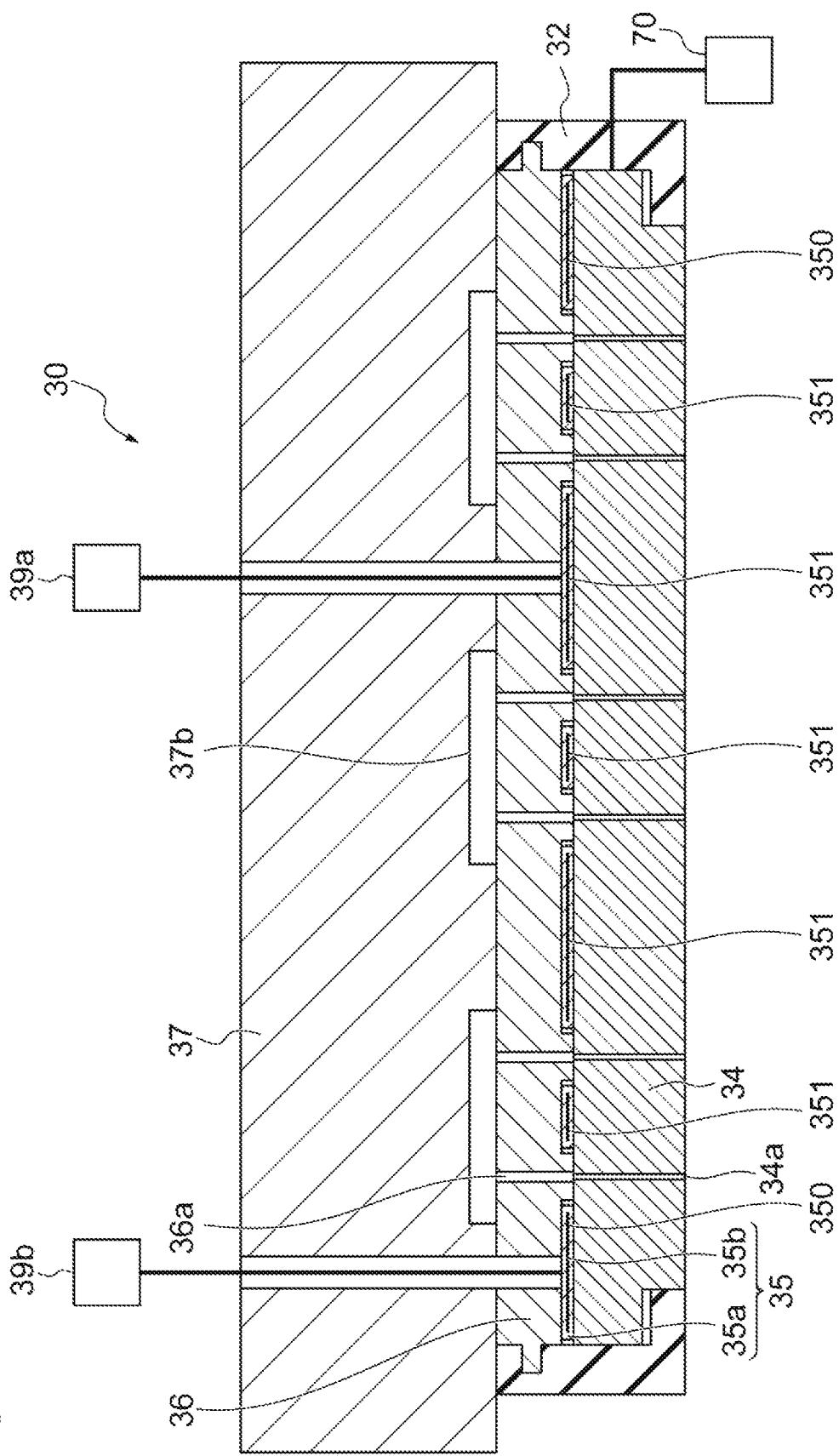
FIG. 4 is a sectional view of the upper electrode according to an exemplary embodiment.
Figure 5:
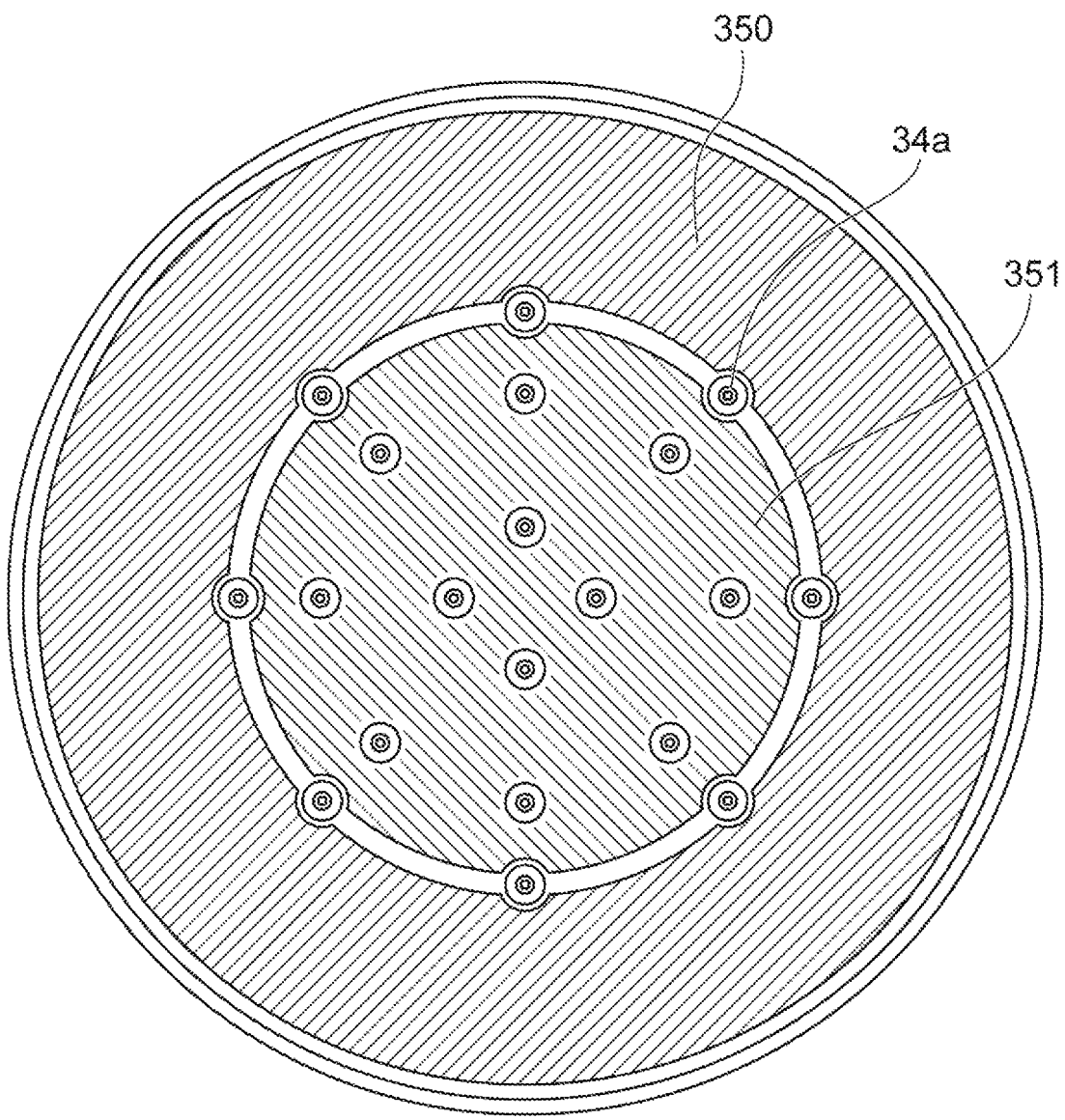
FIG. 5 illustrates an example of a layout of a first electrode and a second electrode.

FIG. 4 is a sectional view of the upper electrode according to an exemplary embodiment. As shown in FIG. 4, a first direct-current power source 39a and a second direct-current power source 39b are connected to the electrostatic chuck 35. Here, although two direct-current power sources are shown, the number of direct-current power sources is not limited. The number of direct-current power sources may correspond to the number of electrodes which are control targets, of the electrostatic chuck 35. That is, in the example of FIG. 4, the electrostatic chuck 35 includes a first electrode 351 and a second electrode 350. FIG. 5 is a diagram schematically showing an example of the layout of the first electrode and the second electrode. As shown in FIGS. 4 and 5, the first electrode 351 is disposed at the central portion of the electrostatic chuck 35, and the second electrode 350 is disposed to surround the periphery of the first electrode 351. Each of the first electrode 351 and the second electrode 350 has a shape in which it is cut off at the periphery of the gas discharge hole 34a. The main bodies of the first electrode 351 and the second electrode 350 may be separate bodies as a first main body and a second main body, respectively, or may be an integrated single main body. Hereinafter, for convenience, the configuration of the electrostatic chuck 35 related to the first electrode 351 is also referred to as a first attraction part, and the configuration of the electrostatic chuck 35 related to the second electrode 350 is also referred to as a second attraction part.

Voltages having different polarities may be applied to the first electrode 351 and the second electrode 350. In this case, the electrostatic chuck 35 attracts the electrode 34 in a bipolar manner. Voltages having the same polarity may be applied to the first electrode 351 and the second electrode 350. In this case, the electrostatic chuck 35 attracts the electrode 34 in a monopolar manner. Details of voltage application processing will be described later.

[Details of Shield]

Figure 6:
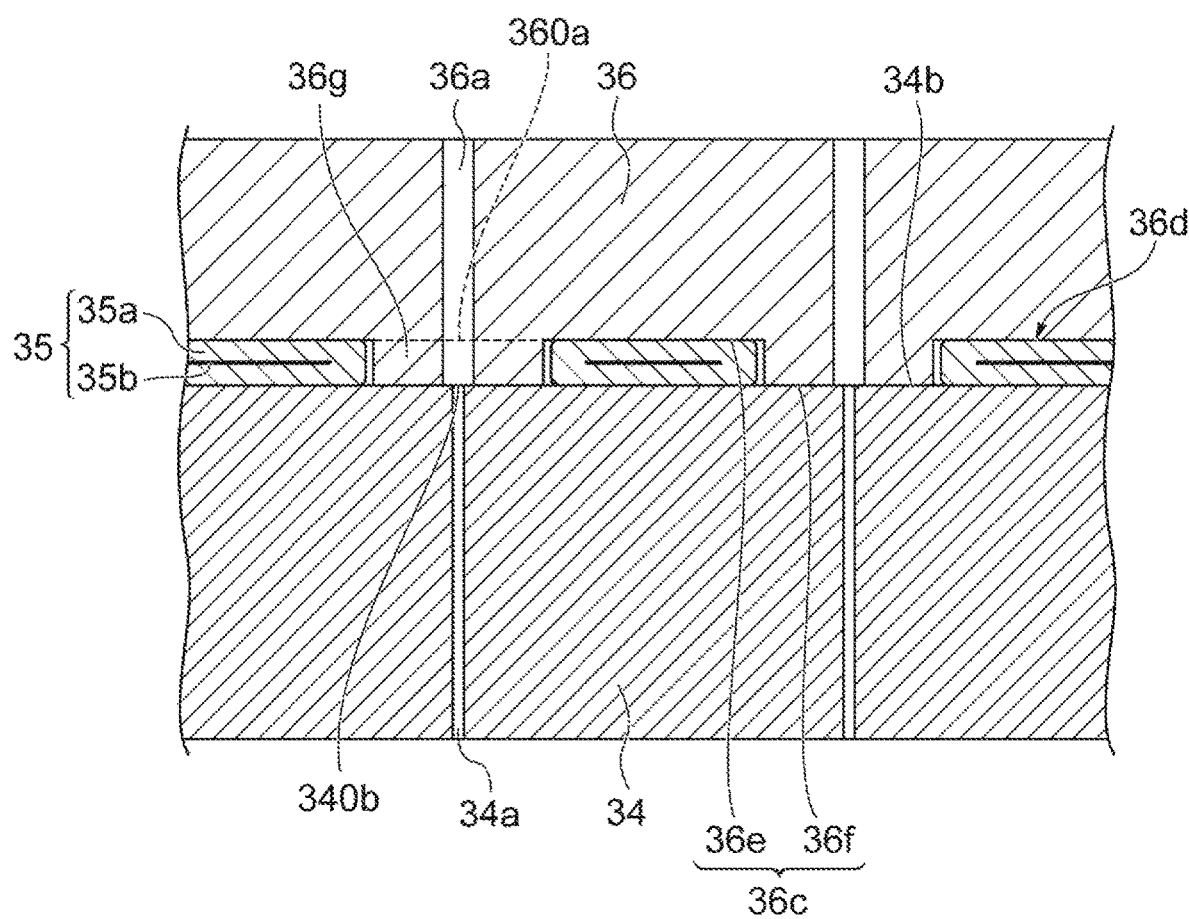
FIG. 6 is a partially enlarged view showing an example of a shield.

The upper electrode 30 has a shield. The shield shields radicals or gas moving from the gas discharge hole 34a to the gap between the electrode 34 and the gas plate 36. FIG. 6 is a partially enlarged view showing an example of the shield. FIG. 6 is a partially enlarged view of FIG. 3. The shield shown in FIG. 6 is a protrusion portion 36g (an example of a connector) on the lower surface 36c of the gas plate 36. That is, in the example of FIG. 6, the gas plate 36 has a shield. The protrusion portion 36g is formed to surround a lower end 360a of the gas flow path 36a. In this way, the lower end 360a of the gas flow path 36a and an upper end 340b of the gas discharge hole 34a are connected to each other by an internal flow path of the protrusion portion 36g. The protrusion portion 36g is in close contact with the upper surface 34b of the electrode 34, and therefore, it is possible to physically shield radicals or gas moving from the gas discharge hole 34a to the gap between the electrode 34 and the gas plate 36.

Figure 7:
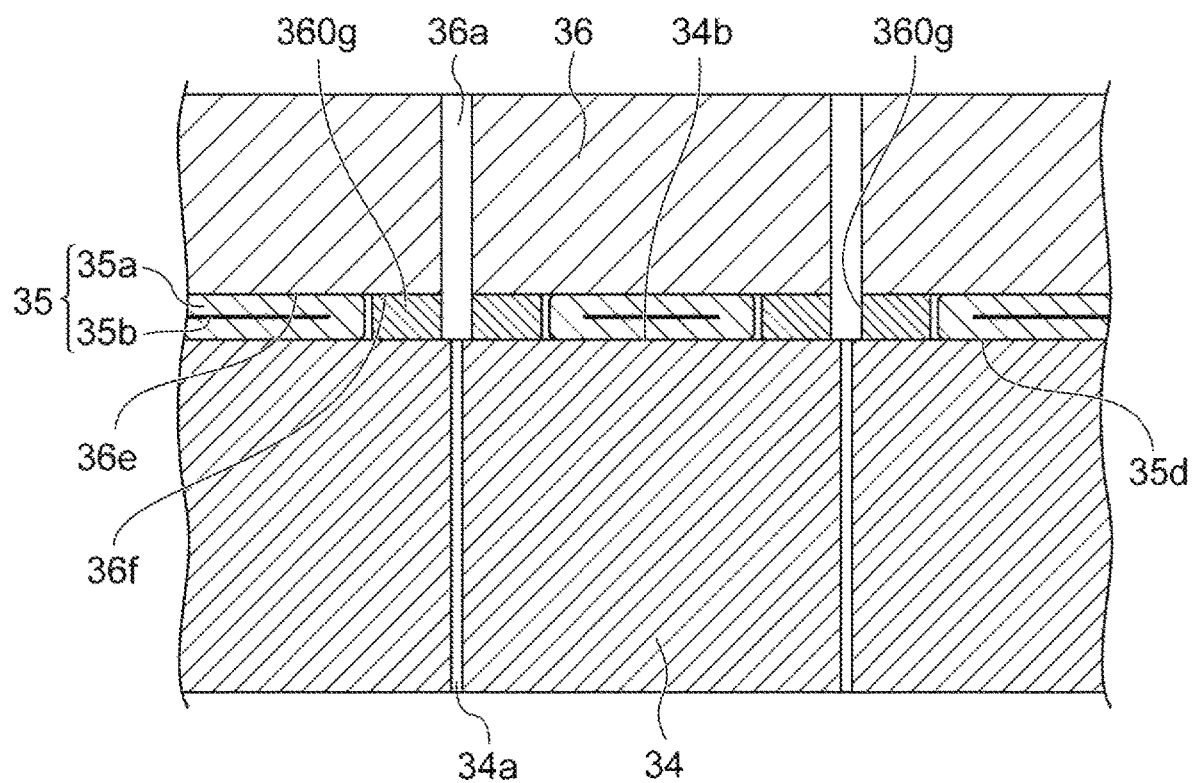
FIG. 7 is a partially enlarged view showing another example of the shield.

The shield is not limited to the example shown in FIG. 6 and can be realized in various aspects. FIG. 7 is a partially enlarged view showing another example of the shield. As shown in FIG. 7, the shield has a connector 360g (an example of a connector) that is disposed between the electrode 34 and the gas plate 36 and connects the upper end of the gas discharge hole 34a and the lower end of the gas flow path 36a. The connector 360g is a member corresponding to the protrusion portion 36g shown in FIG. 6 and is configured separately from the gas plate 36 and the electrode 34. The upper end of the connector 360g is connected to the second region 36f of the lower surface of the gas plate 36, and the lower end thereof is connected to the upper surface 34b of the electrode 34. The connector 360g defines, in the interior thereof, an internal flow path communicating with the gas discharge hole 34a and the gas flow path 36a. The connector 360g is in close contact with the second region 36f of the lower surface of the gas plate 36 and the upper surface 34b of the electrode 34, and therefore, it is possible to physically shield radicals or gas moving from the gas discharge hole 34a to the gap between the electrode 34 and the gas plate 36.

Figure 8:
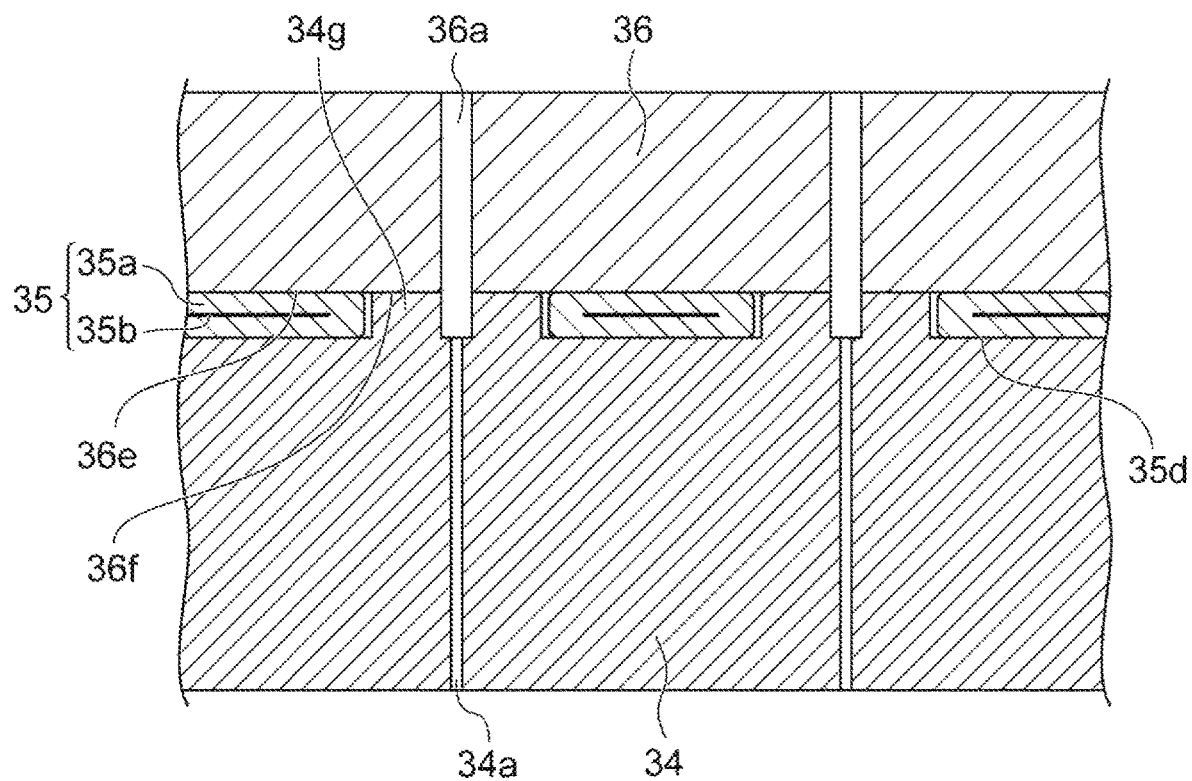
FIG. 8 is a partially enlarged view showing another example of the shield.

FIG. 8 is a partially enlarged view showing another example of the shield. As shown in FIG. 8, the shield is a protrusion portion 34g (an example of a connector) on the upper surface of the electrode 34, and the protrusion portion 34g corresponds to the protrusion portion 36g shown in FIG. 6. That is, in the example of FIG. 8, the electrode 34 has a shield. The protrusion portion 34g of the electrode 34 is in close contact with the second region 36f of the lower surface of the gas plate 36, and therefore, it is possible to physically shield radicals or gas moving from the gas discharge hole 34a to the gap between the electrode 34 and the gas plate 36. The connector may be composed of a combination of the protrusion portion 34g and the protrusion portion 36g. That is, the connector may be configured by combining an upper connector corresponding to the protrusion portion 36g and a lower member corresponding to the protrusion portion 34g.

Figure 9:
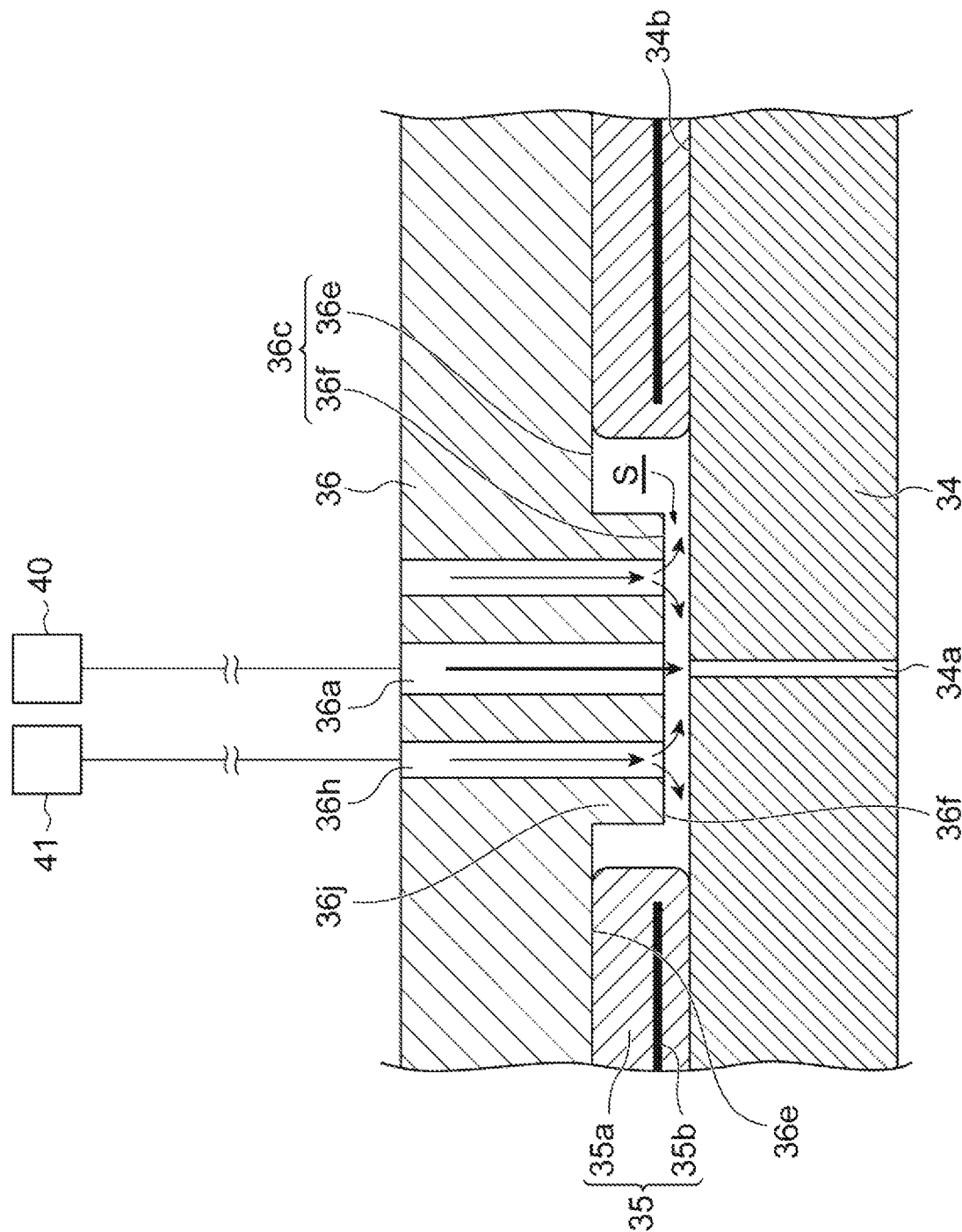
FIG. 9 is a partially enlarged view showing another example of the shield.

FIG. 9 is a partially enlarged view showing another example of the shield. As shown in FIG. 9, the shield has a gas source group 41 (an example of a gas supply source) and a supply flow path 36h connected to the gas source group 41. The gas source group 41 is configured in the same manner as the gas source group 40 and can include a plurality of gas supply sources. At least one of the plurality of gas supply sources supplies a shielding gas to the supply flow path 36h. The supply flow path 36h is formed in the gas plate 36, and is formed to surround the periphery of the gas flow path 36a of the gas plate 36, as an example. The lower surface 36c of the gas plate 36 corresponding to the lower end portions of the gas flow path 36a and the supply flow path 36h protrudes downward to form a protrusion portion 36j. The lower end surface of the protrusion portion 36j is the second region 36f of the gas plate 36. The lower end of the supply flow path 36h is located in the second region 36f of the lower surface 36c of the gas plate 36. A gap is formed between the second region 36f and the upper surface 34b of the electrode 34 to provide a space S. A shielding gas is supplied from the supply flow path 36h to the space S, thereby shielding radicals or gas moving to the gap between the electrode 34 and the gas plate 36. The component of the shielding gas can be the same as the component of the processing gas which is supplied by the gas source group 40. An example of the shielding gas is argon gas.

In the shield shown in FIG. 9, the protrusion portion 36j may not exist. Further, in a case where the electrode 34 and the gas plate 36 are in contact with each other, the temperature of the contact portion becomes 500° C. or higher during plasma generation. In this case, there is a concern that the contact portion between the electrode 34 and the gas plate 36 may deteriorate. In the shield shown in FIG. 9, the electrode 34 and the gas plate 36 are not in contact with each other. For this reason, the deterioration due to contact can be prevented. Further, generation of particles due to friction or wear resulting from a difference in thermal expansion between the electrode 34 and the gas plate 36 can be suppressed.

Figure 10:
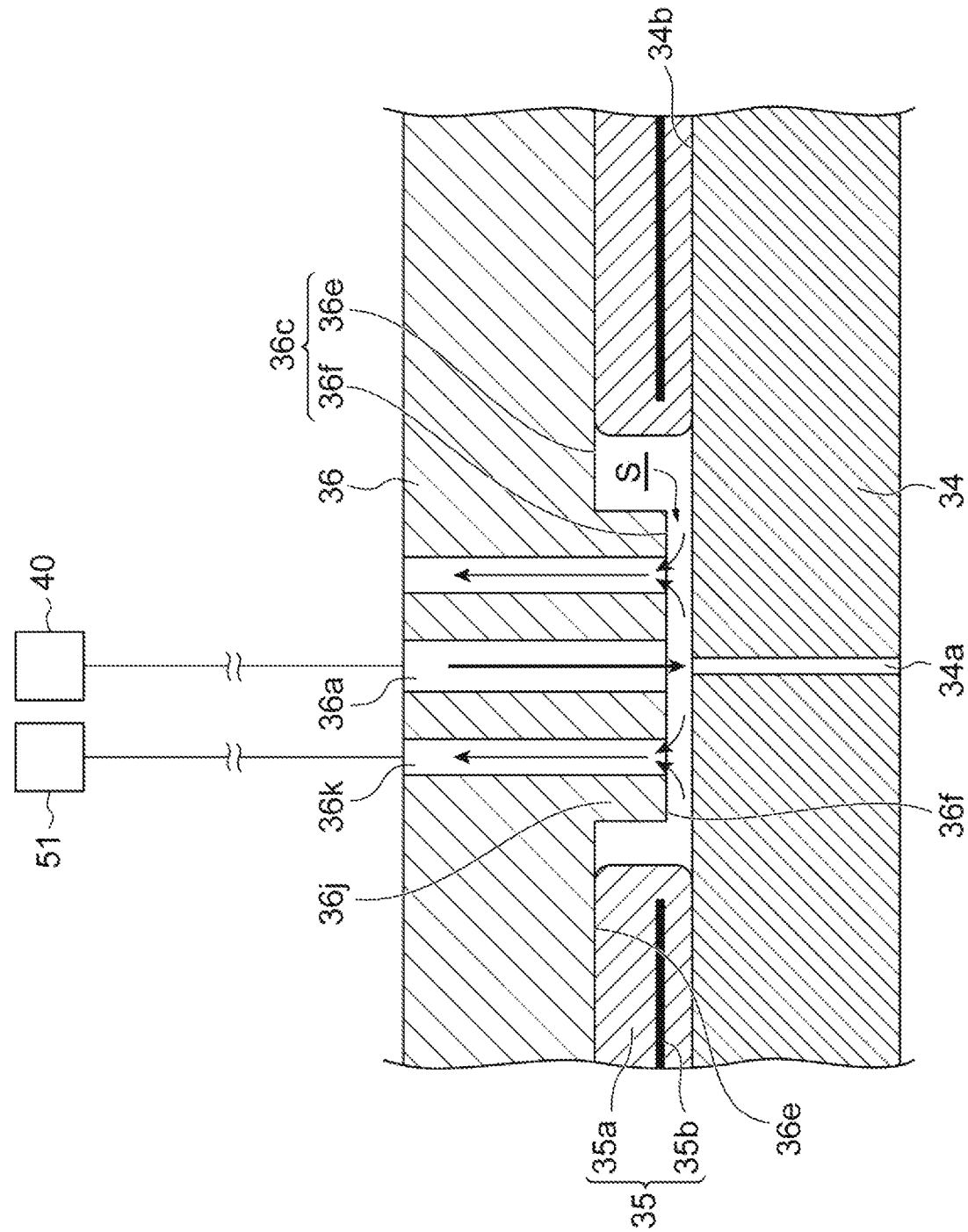
FIG. 10 is a partially enlarged view showing another example of the shield.

FIG. 10 is a partially enlarged view showing another example of the shield. As shown in FIG. 10, the shield has an exhaust device 51 and an exhaust flow path 36k connected to the exhaust device 51. The exhaust device 51 is a depressurizable device and is a vacuum pump as an example. The exhaust flow path 36k is formed in the gas plate 36, and is formed to surround the periphery of the gas flow path 36a of the gas plate 36, as an example. The lower surface 36c of the gas plate 36 corresponding to the lower end portions of the gas flow path 36a and the exhaust flow path 36k protrudes downward to form the protrusion portion 36j. The lower end surface of the protrusion portion 36j is the second region 36f of the gas plate 36. The lower end of the exhaust flow path 36k is located in the second region 36f of the lower surface 36c of the gas plate 36. A gap is formed between the second region 36f and the upper surface 34b of the electrode 34 to provide the space S. The exhaust device 51 decompresses the space S through the exhaust flow path 36k, thereby shielding radicals or gas moving to the gap between the electrode 34 and the gas plate 36.

In the shield shown in FIG. 10, the protrusion portion 36j may not exist. In the shield shown in FIG. 10, similar to the shield shown in FIG. 9, the electrode 34 and the gas plate 36 are not in contact with each other. For this reason, the deterioration due to contact can be prevented. Further, generation of particles due to friction or wear resulting from a difference in thermal expansion between the electrode 34 and the gas plate 36 can be suppressed.

Figure 11:
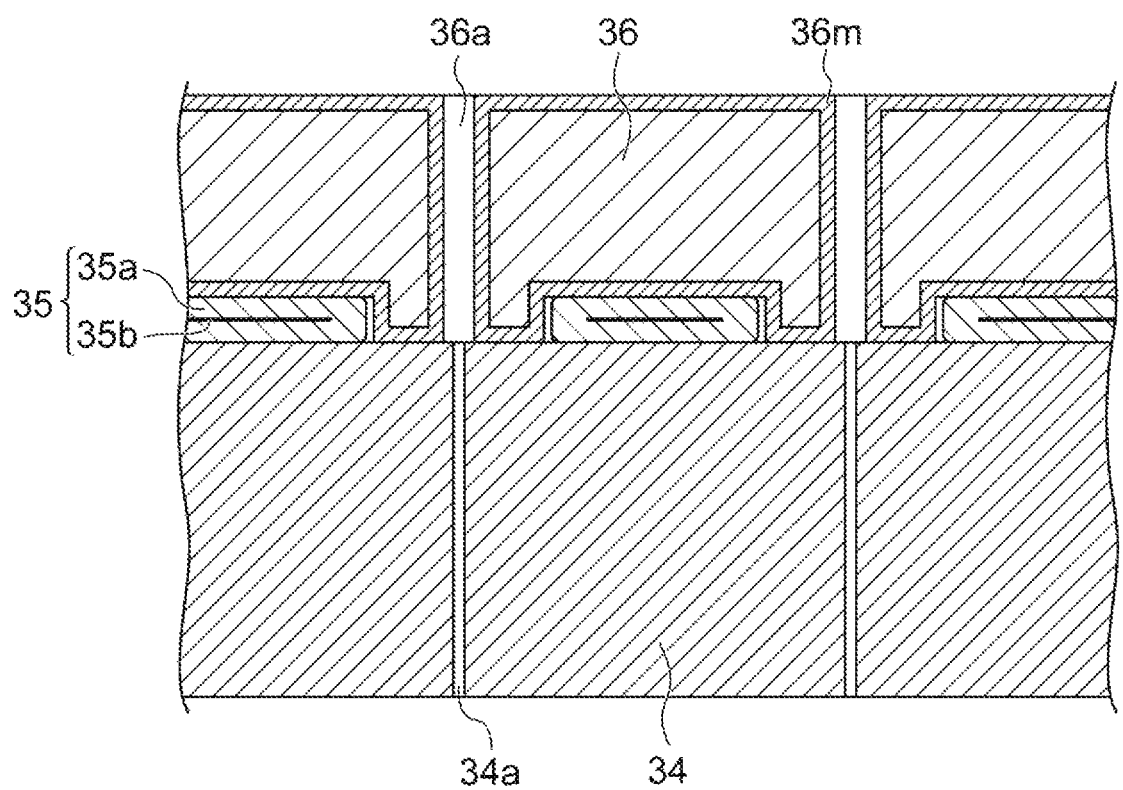
FIG. 11 is a partially enlarged view showing another example of the shield.

FIG. 11 is a partially enlarged view showing another example of the shield. The contact interface between the electrode 34 and the gas plate 36 may be subjected to treatment for preventing deterioration. As an example, as shown in FIG. 11, the gas plate 36 may have a passivation layer 36m at least at a point of contact with the electrode 34. In this way, the deterioration by contact can be prevented. For example, in a case where the material for forming the gas plate 36 is silicon and the material for forming the electrode 34 is a metal, there is a concern that silicide may be formed at the point of contact between the gas plate 36 and the electrode 34. The passivation layer 36m can prevent the point of contact from changing into silicide. Further, the shield is provided with the passivation layer 36m, whereby it is possible to suppress the generation of particles that are difficult to be removed by cleaning processing. An example of such a particle is aluminum fluoride.

[Assembling Method]

Figure 12:
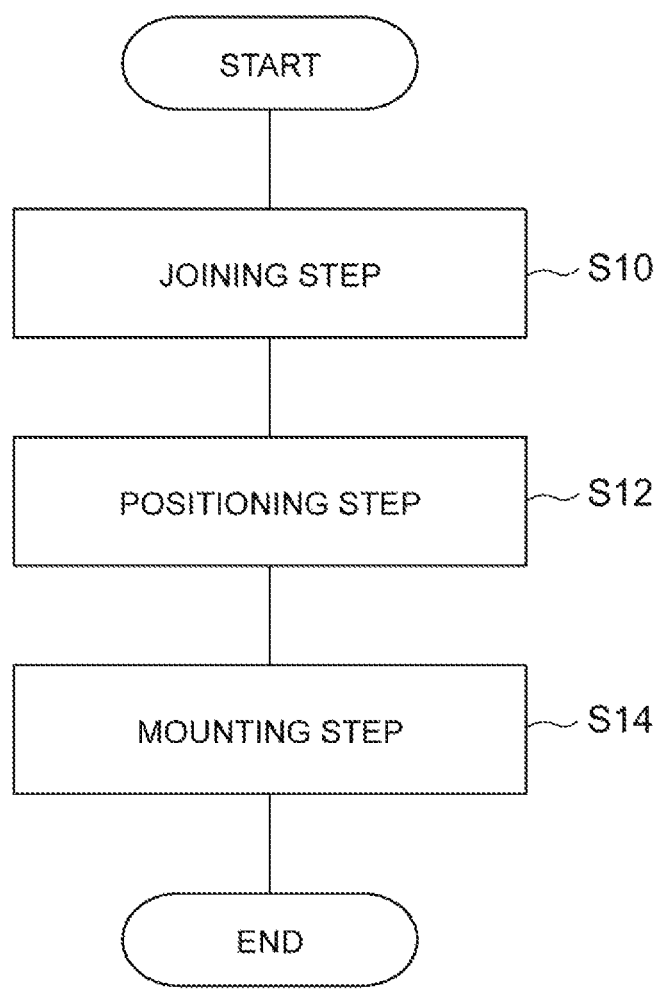
FIG. 12 illustrates a method according to an exemplary embodiment.

FIG. 12 is a diagram schematically showing a method according to an exemplary embodiment. The method shown in FIG. 12 is a method of assembling the upper electrode. This method includes a joining step (step S10), a positioning step (step S12), and a mounting step (step S14).

First, the joining step (step S10) is carried out. In this step, the upper surface (the contact surface 35c) of the electrostatic chuck 35 is joined to the first region 36e of the lower surface 36c of the gas plate 36. Subsequently, in the positioning step (step S12), the upper surface 34b of the electrode 34 and the lower surface 36c of the gas plate 36 are positioned to satisfy the following conditions.

The conditions include that a connector thinner than the electrostatic chuck 35 is located between the upper surface 34b of the electrode 34 and the second region 36f of the lower surface 36c of the gas plate 36. The connector may be, for example, the protrusion portion 36g in FIG. 6, the connector 360g in FIG. 7, or the protrusion portion 34g in FIG. 8. The conditions include that the gas discharge hole 34a formed in the electrode 34 faces the gas flow path 36a. For example, the gas discharge hole 34a and the gas flow path 36a are disposed coaxially. The conditions include that the upper surface 34b of the electrode 34 is in contact with the lower surface (the attraction surface 35d) of the electrostatic chuck 35.

Subsequently, in the mounting step (step S14), the member 32 supporting the positioned electrode 34 is mounted to the gas plate 36. Thus, the upper electrode 30 is completed. When the electrode 34 is attracted and pressed against the gas plate 36 by the electrostatic chuck 35, the electrostatic chuck 35 is compressed between the upper surface 34b of the electrode 34 and the lower surface 36c of the gas plate 36. In this way, the upper surface 34b of the electrode 34 butts against the connector, and therefore, positioning in the height direction (thickness direction) can be performed. For this reason, the mounting height accuracy is improved, and as a result, it is possible to suppress a decrease in accuracy of temperature adjustment of the electrode 34.

[Method of Controlling Electrostatic Chuck]

The electrostatic chuck 35 can have the first electrode 351 and the second electrode 350, as shown in FIGS. 4 and 5.

Figure 13:
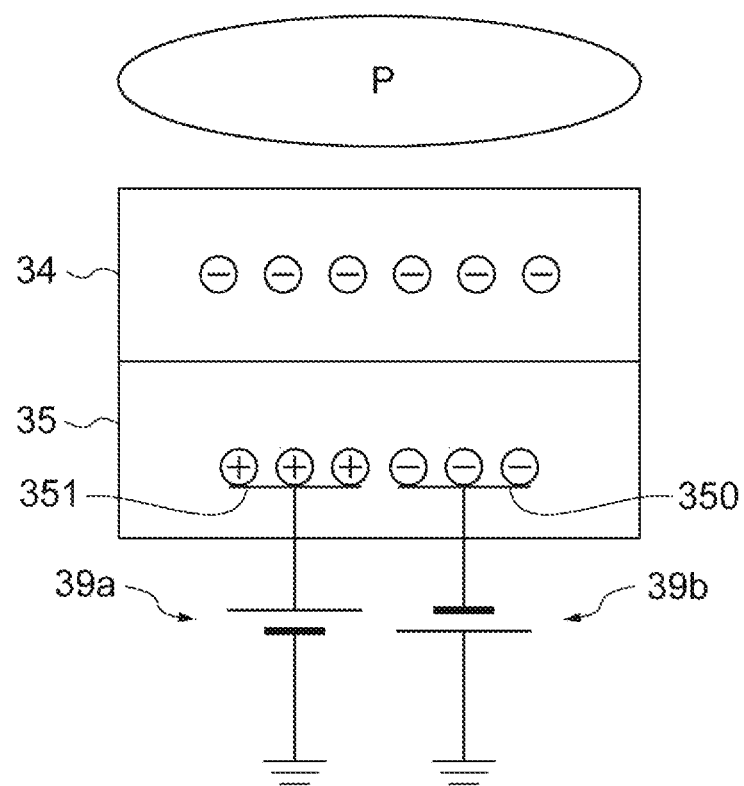
FIG. 13 is a diagram for explaining an example of attraction in a bipolar manner.

The first direct-current power source 39a and the second direct-current power source 39b apply a voltage having a controlled polarity to the electrodes. FIG. 13 is a diagram for explaining an example of attraction in a bipolar manner. As shown in FIG. 13, the first direct-current power source 39a of the electrostatic chuck 35 applies a positive voltage to the first electrode 351. The first electrode 351 is positively charged. The second direct-current power source 39b of the electrostatic chuck 35 applies a negative voltage to the second electrode 350. The second electrode 350 is negatively charged. In a case where plasma P is not generated, a part of the electrode 34 facing the first electrode 351 is negatively charged and a part of the electrode 34 facing the second electrode 350 is positively charged. For this reason, the electrode 34 is held by an electrostatic attraction force. On the other hand, in a case where the plasma P is generated, a negative self-bias is generated in the electrode 34, and thus the electrode 34 is negatively charged. In this manner, the bipolar manner can generate an attraction force even in a case where the plasma P is not generated.

Figure 14:
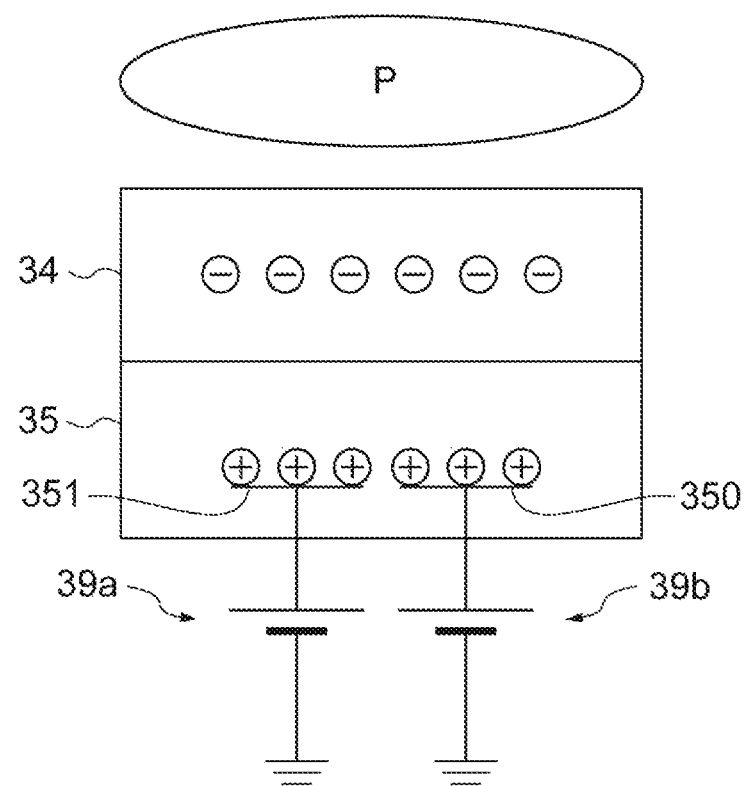
FIG. 14 is a diagram for explaining an example of attraction in a monopolar manner.

FIG. 14 is a diagram for explaining an example of attraction in a monopolar manner. As shown in FIG. 14, the first direct-current power source 39a of the electrostatic chuck 35 applies a positive voltage to the first electrode 351. The first electrode 351 is positively charged. Further, the second direct-current power source 39b of the electrostatic chuck 35 applies a positive voltage to the second electrode 350. The second electrode 350 is positively charged. In this manner, in the monopolar manner, if the inflow of charges, that is, the plasma P is not generated, the attraction force cannot be generated.

The controller Cnt can switch the attraction method by controlling the first direct-current power source 39a and the second direct-current power source 39b.

Figure 15:
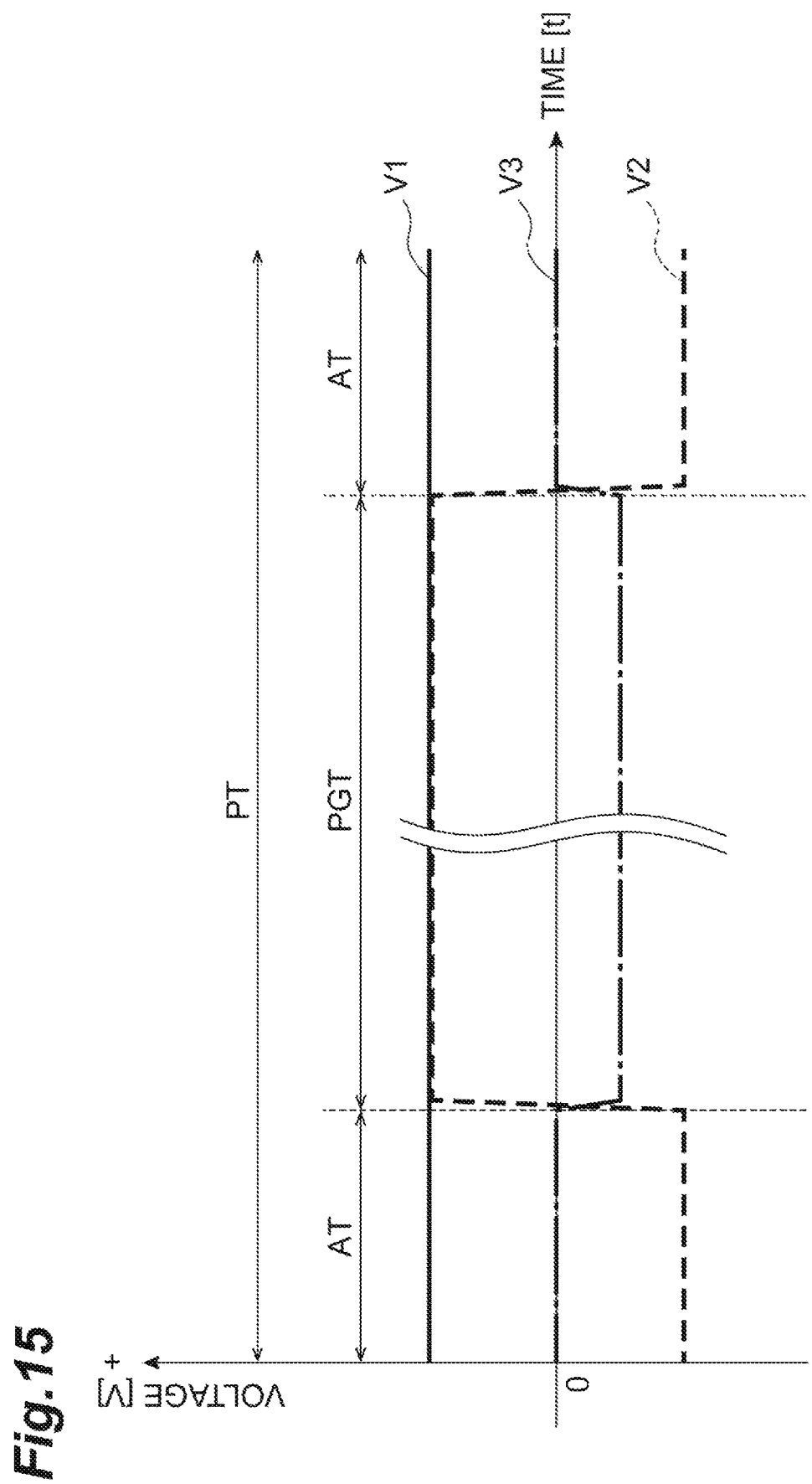
FIG. 15 is a graph showing an example of the relationship between voltage which is applied to the first electrode and the second electrode and time.

FIG. 15 is a graph showing an example of the relationship between the voltage which is applied to the first electrode and the second electrode and time. The horizontal axis represents time, and the vertical axis represents voltage. In FIG. 15, a process period PT by the plasma processing apparatus 10 is shown. The process period PT alternately includes a plasma generation period PGT and an idle period AT. The plasma generation period PGT is a period in which plasma is generated by the plasma processing apparatus 10. The idle period AT is a period in which plasma is not generated by the plasma processing apparatus 10.

The controller Cnt applies voltages having different polarities to the first electrode 351 and the second electrode 350 of the electrostatic chuck 35 at least in the idle period AT. For example, as shown in FIG. 15, the controller Cnt applies a voltage indicated by a voltage pattern V1 to the first electrode 351 and applies a voltage indicated by a voltage pattern V2 to the second electrode 350. The voltage pattern V1 is a pattern having a voltage having a positive polarity in any case of the idle period AT and the plasma generation period PGT. That is, a voltage having a positive polarity is always applied to the first electrode 351. On the other hand, the voltage pattern V2 is a pattern having a voltage having a negative polarity in the case of the idle period AT and having a voltage having a positive polarity in the case of the plasma generation period PGT. That is, a voltage having a negative polarity is applied to the second electrode 350 in the idle period AT, and a voltage having a positive polarity is applied to the second electrode 350 in the plasma generation period PGT. A voltage pattern V3 in FIG. 15 is a pattern of a voltage which is applied to the electrode 34 by the direct-current power source unit 70. The direct-current power source unit 70 may continuously apply a voltage or may apply a pulsed voltage. Further, the direct-current power source unit 70 may not be provided.

In this manner, the controller Cnt holds the electrode 34 in a bipolar manner during the idle period AT, thereby allowing the electrode to be attracted to the temperature-controlled gas plate 36. In this way, even during the idle period AT in which there is no heat input from plasma, the temperature of the electrode 34 is adjusted, whereby it is possible to efficiently perform the temperature adjustment of the electrode 34 in the subsequent plasma generation period PGT.

Further, the controller Cnt applies a positive voltage to each of the first electrode 351 and the second electrode 350 in the plasma generation period PGT to hold the electrode 34 in a monopolar manner. In this way, the electrode 34 can be held and adjusted in temperature without lowering the attraction force during the plasma generation.

Figure 16:
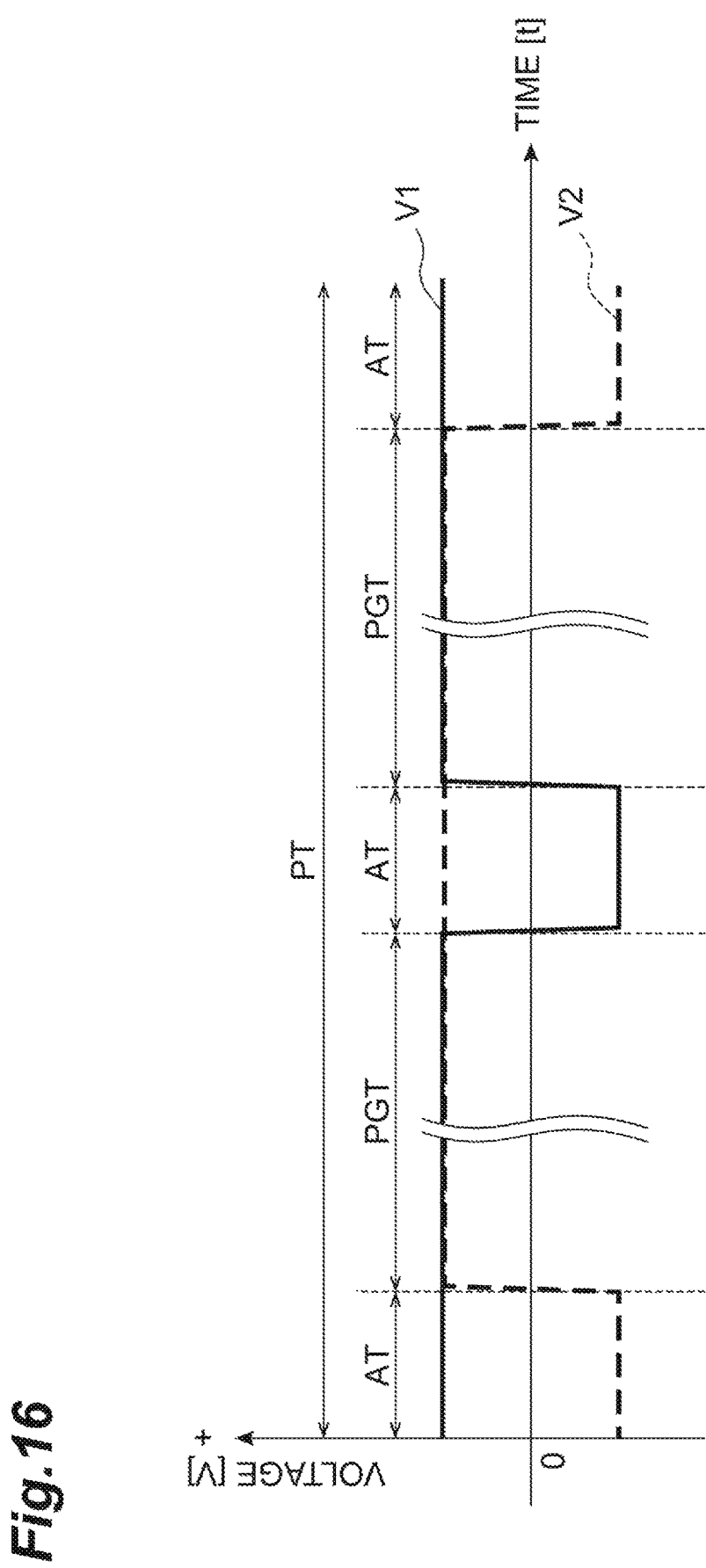
FIG. 16 is a graph showing an example of the relationship between voltage which is applied to the first electrode and the second electrode and time.

Next, another control method by the controller Cnt will be illustrated. FIG. 16 is a graph showing an example of the relationship between the voltage which is applied to the first electrode and the second electrode and time. The horizontal axis represents time, and the vertical axis represents voltage. In FIG. 16, the process period PT by the plasma processing apparatus 10 is shown. The process period PT alternately includes the plasma generation period PGT and the idle period AT.

The voltage pattern V1 shown in FIG. 16 has a positive voltage in the first idle period AT, a negative voltage in the subsequent idle period AT, and a positive voltage in the next idle period AT. The plasma generation period PGT always has a positive voltage. On the other hand, the voltage pattern V2 has a negative voltage in the first idle period AT, a positive voltage in the subsequent idle period AT, and a negative voltage in the next idle period AT. The plasma generation period PGT always has a positive voltage. In this manner, the polarity of the voltage which is applied to each of the first electrode 351 and the second electrode 350 is switched every the idle period AT. By applying a voltage in this way, the polarity of the electrode is not fixed at a single polarity, and therefore, it is possible to avoid the movement (migration) of charges in one direction. In this way, it is possible to avoid a decrease in attraction force.

Figure 17:
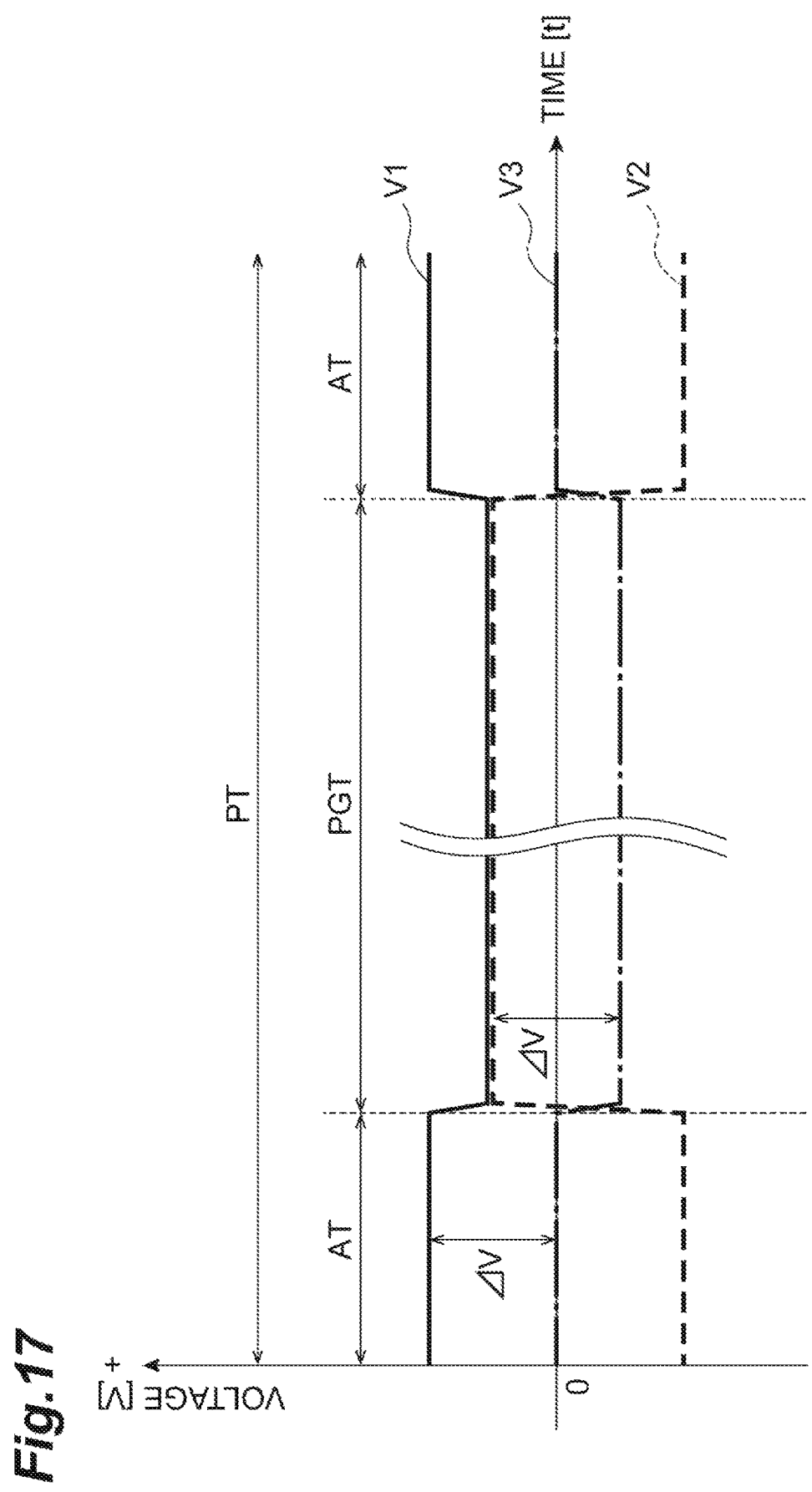
FIG. 17 is a graph showing an example of the relationship between voltage which is applied to the first electrode and the second electrode and time.

FIG. 17 is a graph showing an example of the relationship between the voltage which is applied to the first electrode and the second electrode and time. The horizontal axis represents time, and the vertical axis represents voltage. In FIG. 17, the process period PT by the plasma processing apparatus 10 is shown. The process period PT alternately includes the plasma generation period PGT and the idle period AT. The controller Cnt applies a voltage indicated by the voltage pattern V1 to the first electrode 351 and applies a voltage indicated by the voltage pattern V2 to the second electrode 350. The voltage pattern V1 shown in FIG. 17 is the same as the voltage pattern V1 shown in FIG. 15 in that it has a positive voltage throughout the process period PT. However, in the voltage pattern V1 shown in FIG. 17, the magnitude of the positive voltage in the plasma generation period PGT is different from that in the voltage pattern V1 shown in FIG. 15. Specifically, the voltage pattern V1 may be changed such that an effective difference $\Delta V$ between the positive voltage which is applied to the first electrode 351 and the voltage which is applied to the electrode 34 in the idle period AT is constant throughout the process period PT. Similarly, in the voltage pattern V2 shown in FIG. 17, the positive and negative polarities thereof are the same as those in the voltage pattern V2 shown in FIG. 15. However, the magnitude of the positive voltage in the plasma generation period PGT is different from that in the voltage pattern V1 shown in FIG. 15. Specifically, the voltage pattern V2 is changed such that an effective difference ΔV between the positive voltage which is applied to the first electrode 351 and the voltage which is applied to the electrode 34 in the idle period AT is constant throughout the process period PT. In the drawing, a case where the negative self-bias which is generated in the electrode 34 is smaller than the voltage indicated by the voltage pattern V3 is shown. In a case where the negative self-bias which is generated in the electrode 34 is equal to or higher than the voltage indicated by the voltage pattern V3, the effective difference ΔV is calculated based on the negative self-bias, and the voltage patterns V1 and V2 are changed.

Various exemplary embodiments have been described above. However, the present disclosure is not limited to the exemplary embodiments described above, and various omissions, substitutions, and changes may be made. Further, it is possible to combine the elements in different embodiments to form other embodiments.

For example, although the plasma processing apparatus 10 is a capacitively coupled plasma processing apparatus, the plasma processing apparatus according to another embodiment may be a different type of plasma processing apparatus. Such a plasma processing apparatus can be any type of plasma processing apparatus. As such a plasma processing apparatus, an inductively coupled plasma processing apparatus, and a plasma processing apparatus that generates plasma by surface waves such as microwaves are exemplified.

Further, as the plasma processing apparatus 10, an example is shown in which two radio frequency power sources are connected to the lower electrode 18 and a direct-current power source is connected to the upper electrode 30. However, there is no limitation thereto. For example, the plasma processing apparatus 10 may not include the upper electrode 30. For example, in the plasma processing apparatus 10, a radio frequency power source may be connected to the lower electrode 18 and the upper electrode 30.

From the above description, it will be understood that various embodiments of the present disclosure have been described in the present specification for purposes of description and that various modifications can be made without departing from the scope and gist of the present disclosure. Therefore, the various embodiments disclosed in the present specification are not intended to limit the present disclosure and the true scope and gist are indicated by the appended claims.

What is claimed is:

1. A plasma processing apparatus comprising:
a plasma processing chamber;
a substrate support disposed in the plasma processing chamber, the substrate support including a lower electrode; and
an upper electrode structure disposed above the substrate support, the upper electrode structure including:
a cooling plate having at least one coolant passage;
an electrode plate disposed below the cooling plate, the electrode plate having a first through hole;
a conductive plate disposed between the cooling plate and the electrode plate, the conductive plate having a second through hole;
an elastic electrostatic attracting layer sandwiched between the electrode plate and the conductive plate, the elastic electrostatic attracting layer having a component hole; and
a shield component disposed in the component hole of the elastic electrostatic attracting layer, the shield component having a third through hole, wherein
the first through hole, the second through hole, and the third through hole are vertically aligned.

2. The plasma processing apparatus according to claim 1, wherein
the shield component is integrated with the conductive plate.

3. The plasma processing apparatus according to claim 1, wherein
the shield component is a separated member.

4. The plasma processing apparatus according to claim 1, wherein
the shield component is integrated with the electrode plate.

5. The plasma processing apparatus according to claim 1, further comprising
a passivation layer disposed between the electrode plate and the conductive plate.

6. The plasma processing apparatus according to claim 1, wherein
the elastic electrostatic attraction layer includes an elastic dielectric body and an electrode disposed inside the body, where the body is compressed between the electrode and the conductive plate, and both the elastic electrostatic attraction layer and the shield component are in tight contact with both the electrode plate and the conductive plate.

7. A plasma processing apparatus comprising:
a plasma processing chamber;
a substrate support disposed in the plasma processing chamber, the substrate support including a lower electrode; and
an upper electrode structure disposed above the substrate support, the upper electrode structure including:
a cooling plate having at least one coolant passage;
an electrode plate disposed below the cooling plate, the electrode plate having a first through hole;
a conductive plate disposed between the cooling plate and the electrode plate, the conductive plate having a second through hole and a plurality of third through holes surrounding the second through hole; and
an elastic electrostatic attracting layer sandwiched between the electrode plate and the conductive plate, the elastic electrostatic attracting layer having a fourth through hole, wherein
the first through hole, the second through hole, and the fourth through hole are vertically aligned; and
the plurality of third through holes each have an upper end connected to an inert gas source or an exhaust device, and a lower end in communication with the fourth through hole.

8. The plasma processing apparatus according to claim 7, wherein
the fourth through holes are connectable to a shield gas source.

9. The plasma processing apparatus according to claim 7, wherein
the fourth through holes are connectable to an exhaust device.

10. The plasma processing apparatus according to claim 1, wherein
the conductive plate has a coolant flow passage.

11. The plasma processing apparatus according to claim 1, further comprising:

a cooling plate disposed on an upper surface of the conductive plate and having a coolant flow passage.

12. The plasma processing apparatus according to claim 1, wherein the elastic electrostatic attraction layer includes
a first attractor segment including a first elastic dielectric body and a first electrode disposed inside the first body, and
a second attractor segment having a second elastic dielectric body and a second electrode disposed inside the second body, and
voltages having different polarities are applied to the first electrode and the second electrode.

13. The plasma processing apparatus according to claim 1, wherein the elastic electrostatic attraction layer includes
a first attractor segment having a first elastic dielectric body and a first electrode disposed inside the first body, and
a second attractor segment having a second elastic dielectric body and a second electrode disposed inside the second body, and
voltages having the same polarity are applied to the first electrode and the second electrode.

14. A plasma processing apparatus comprising:
a plasma processing chamber;
a substrate support disposed in the plasma processing chamber, the substrate support including a lower electrode; and
an upper electrode structure disposed above the substrate support, the upper electrode structure including:
a cooling plate having at least one coolant passage;
an electrode plate disposed below the cooling plate, the electrode plate having a plurality of first through holes;
a conductive plate disposed between the cooling plate and the electrode plate, the conductive plate having a plurality of second through holes corresponding to the first through holes, respectively;
an elastic electrostatic attracting layer sandwiched between the electrode plate and the conductive plate, the elastic electrostatic attracting layer having a plurality of component holes corresponding to the first through holes, respectively; and
a plurality of shield components disposed in the plurality of component holes of the elastic electrostatic attracting layer, respectively, each shield component having a third through hole, wherein
the first through hole is in communication with the corresponding second through hole through the corresponding third through hole.

15. The plasma processing apparatus according to claim 14, wherein
the plurality of shield components are integrated with the conductive plate.

* * * * *